(12) United States Patent
Li et al.

(10) Patent No.: US 11,552,303 B2
(45) Date of Patent: Jan. 10, 2023

(54) METHODS, CATALYSTS, AND SUPPORTS FOR ELECTROCHEMICAL DEVICES

(71) Applicant: UNIVERSITY OF WYOMING, Laramie, WY (US)

(72) Inventors: Dongmei Li, Laramie, WY (US); Shibely Saha, Laramie, WY (US); Brian Leonard, Laramie, WY (US)

(73) Assignee: UNIVERSITY OF WYOMING, Laramie, WY (US)

( * ) Notice: Subject to any disclaimer, the term of this patent is extended or adjusted under 35 U.S.C. 154(b) by 221 days.

(21) Appl. No.: 17/024,978

(22) Filed: Sep. 18, 2020

(65) Prior Publication Data
US 2021/0005901 A1 Jan. 7, 2021

Related U.S. Application Data

(62) Division of application No. 15/456,037, filed on Mar. 10, 2017, now Pat. No. 10,818,933.

(60) Provisional application No. 62/307,450, filed on Mar. 12, 2016.

(51) Int. Cl.
*H01M 4/92* (2006.01)
*H01M 8/1004* (2016.01)

(52) U.S. Cl.
CPC ......... *H01M 4/925* (2013.01); *H01M 8/1004* (2013.01)

(58) Field of Classification Search
CPC ............... C23C 16/18; C23C 16/4417; C23C 16/45551; C23C 16/45555; H01M 2008/1095; H01M 4/925; H01M 8/1004; H01M 60/50
See application file for complete search history.

(56) References Cited

U.S. PATENT DOCUMENTS

| | | |
|---|---|---|
| 5,183,713 A | 2/1993 | Kunz |
| 7,053,021 B1 | 5/2006 | Zhong et al. |
| 8,080,280 B1 | 12/2011 | Grubbs et al. |
| 2014/0065841 A1 | 3/2014 | Matero |
| 2014/0080694 A1* | 3/2014 | Cai .......... C01B 32/21 502/11 |
| 2014/0209539 A1 | 7/2014 | El Badawi et al. |
| 2015/0086902 A1 | 3/2015 | Hards et al. |
| 2015/0105241 A1 | 4/2015 | Roman-Leshkov et al. |
| 2017/0125828 A1* | 5/2017 | Zhang ........... H01M 8/04955 |

(Continued)

FOREIGN PATENT DOCUMENTS

| | | |
|---|---|---|
| EP | 1952467 A2 | 8/2008 |
| EP | 2887627 A1 | 6/2015 |

OTHER PUBLICATIONS

Regmi et al.: Carbides of group IVA, VA and VIA transition metals as alternative HER and ORR catalysts and support materialist;; J. Mater. Chem A 2015, 3, pp. 10085-10091.

(Continued)

*Primary Examiner* — Victoria H Lynch
(74) *Attorney, Agent, or Firm* — Patterson + Sheridan, LLP

(57) ABSTRACT

Embodiments described herein relate to methods for preparing catalysts and catalyst supports. In one embodiment, transition metal carbide materials, having a nanotube like morphology, are utilized as a support for a precious metal catalyst, such as platinum. Embodiments described herein also relate to proton exchange membrane fuel cells that incorporate the catalysts described herein.

18 Claims, 19 Drawing Sheets

(56) References Cited

U.S. PATENT DOCUMENTS

2018/0159144 A1* 6/2018 Cavaliere ............ H01M 4/9075

OTHER PUBLICATIONS

Schmuecker, SM et al. Formation mechanism of nanostructured metal carbides via salt-flux 9, synthesis. Inorganic chemistry. Mar. 30, 2015. vol. 54. No. 8; p. 3890.

McCormic, JA et al. Rotary reactor for atomic layer deposition on large quantities of nanoparticles. Journal of Vacuum Science & Technology A: Vacuum, Surfaces, and Films. Jan. 2007. vol. 25. No. 1; abstract; p. 71.

International Search Report and Written Opinion of Related application PCT/US17/21861 dated Jul. 14, 2017.

Saha, Shibley et al. Probing synergetic effects between platinum nanoparticles deposited via atomic layer deposition and a molybdenum carbide nanotube support through surface characterization and device performance, J. Mater. Chem. A. 2016, 4, 9253.

AIChEPresentation given Nov. 5, 2013, San Francisco, CA.

* cited by examiner

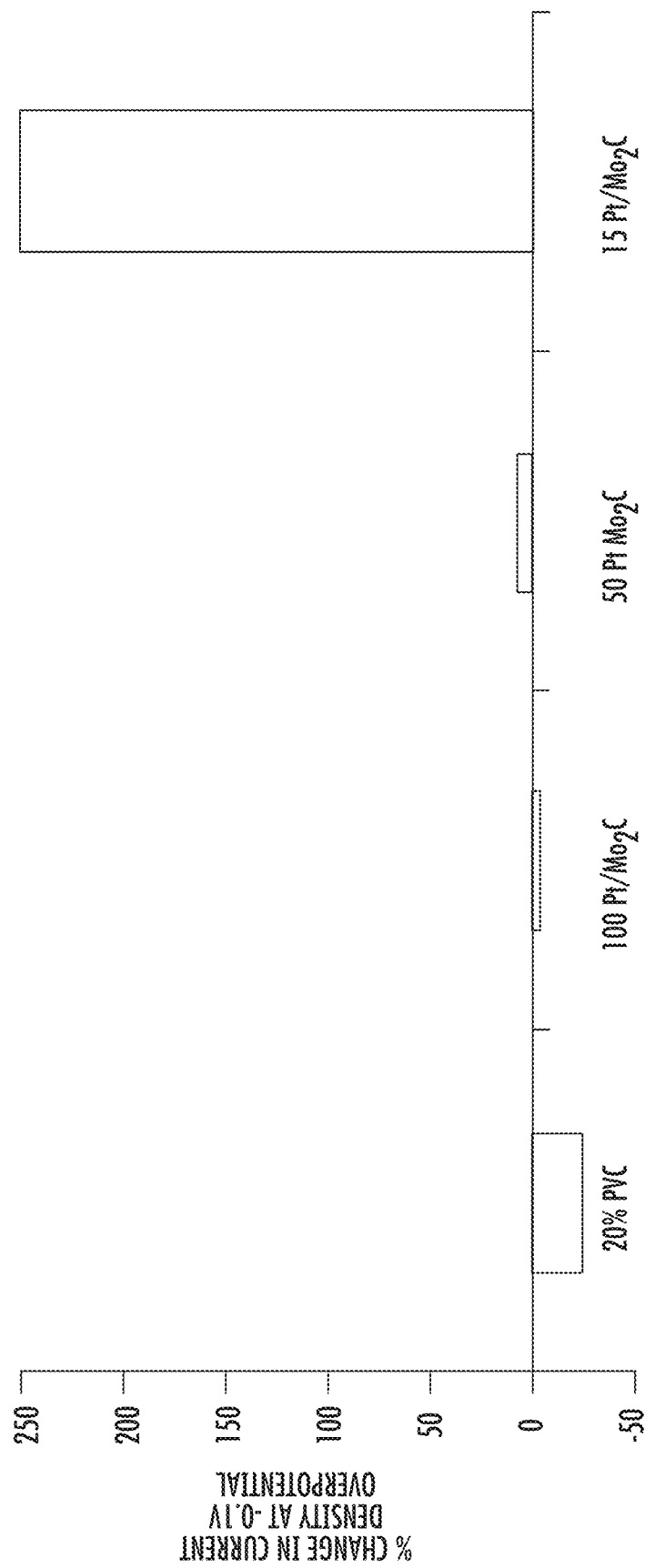

METHODS, CATALYSTS, AND SUPPORTS FOR ELECTROCHEMICAL DEVICES

CROSS-REFERENCE TO RELATED APPLICATIONS

This application is a divisional application of U.S. patent application Ser. No. 15/456,037, filed Mar. 10, 2017, which claims benefit of U.S. Provisional Patent Application No. 62/307,450, filed Mar. 12, 2016, the entirety of which are herein incorporated by reference.

BACKGROUND

Field

Embodiments of the present disclosure generally relate to improved catalysts for fuel cells. More specifically, embodiments described herein relate to methods, catalysts, and supports for fuel cells and other catalytic systems.

Description of the Related Art

Transition metal carbides (TMCs) have been a popular research area due to their similar electronic and geometric structure to platinum (Pt) and Pt group metals. TMCs are not only an order of magnitude less expensive and more abundant than Pt group metals, but have also shown Pt-like catalytic performance in hydrogenation, dehydrogenation and hydrogenolysis. These metal carbides could be an alternative to Pt in hydrogen evolution reactions (HER), hydrogen oxidation (HOR) applications, or oxygen reduction reactions (ORR). However, despite recent advances in carbide research, electrocatalytic activity of group 4 and 6 TMCs are still not comparable to conventional catalysts, such as Pt supported on carbon black (Pt/C).

Accordingly, what is needed in the art are improved supports and catalysts for various catalytic application.

SUMMARY

In one embodiment, a catalyst formation is provided. The method includes preparing a mixture comprising one or more halide slats, multi-walled carbon nanotubes, and a transition metal, heating the mixture to a temperature greater than about 900° C. to form a transition metal carbide support, boiling and rinsing the transition metal carbide support to remove excess salts, and drying the transition metal carbide support. The method also includes depositing platinum on the transition metal carbide support, wherein the depositing comprises atomic layer deposition (ALD) of platinum nanoparticles utilizing a platinum precursor and an oxygen precursor in a rotating ALD reactor.

In another embodiment, a catalyst formation method is provided. The method includes preparing a mixture comprising one or more halide salts, multi-walled carbon nanotubes (MWCNTs) and a transition metal. A ratio of halide salts:MWCNTs:transition metal is about 67:7:26. The mixture is heated to a temperature greater than about 900° C. to form a transition metal carbide support, the transition metal carbide support is boiled and rinsed to remove excess salts, and the transition metal carbide support is dried. The method also includes depositing platinum on the transition metal carbide support, wherein the depositing comprises atomic layer deposition (ALD) of platinum nanoparticles in a rotating ALD reactor and the number of ALD cycles is between about 15 and about 100.

In yet another embodiment, a fuel cell apparatus is provided. The apparatus includes a proton exchange membrane, a first catalyst comprising platinum molybdenum carbide disposed on a first side of the proton exchange membrane and a second catalyst comprising platinum molybdenum carbide disposed on a second side of the proton exchange membrane opposite the first catalyst. The first and second catalysts are phase pure and the platinum is formed as discrete nanoparticles on the molybdenum carbide. The apparatus further includes a first gas diffusion layer disposed on the first side of the proton exchange membrane and the first catalyst is disposed between the first gas diffusion layer and the proton exchange membrane. A second gas diffusion layer is disposed on the second side of the proton exchange membrane and the second catalyst is disposed between the second gas diffusion layer and the proton exchange membrane. An anode is coupled to the first gas diffusion layer and a cathode is coupled to the second gas diffusion layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 8(e) illustrates a graphical comparison of current density change for each of catalysts 20% Pt/C, 100 Pt/Mo$_2$C, 50 Pt/Mo$_2$C, and 15 Pt/Mo$_2$C according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
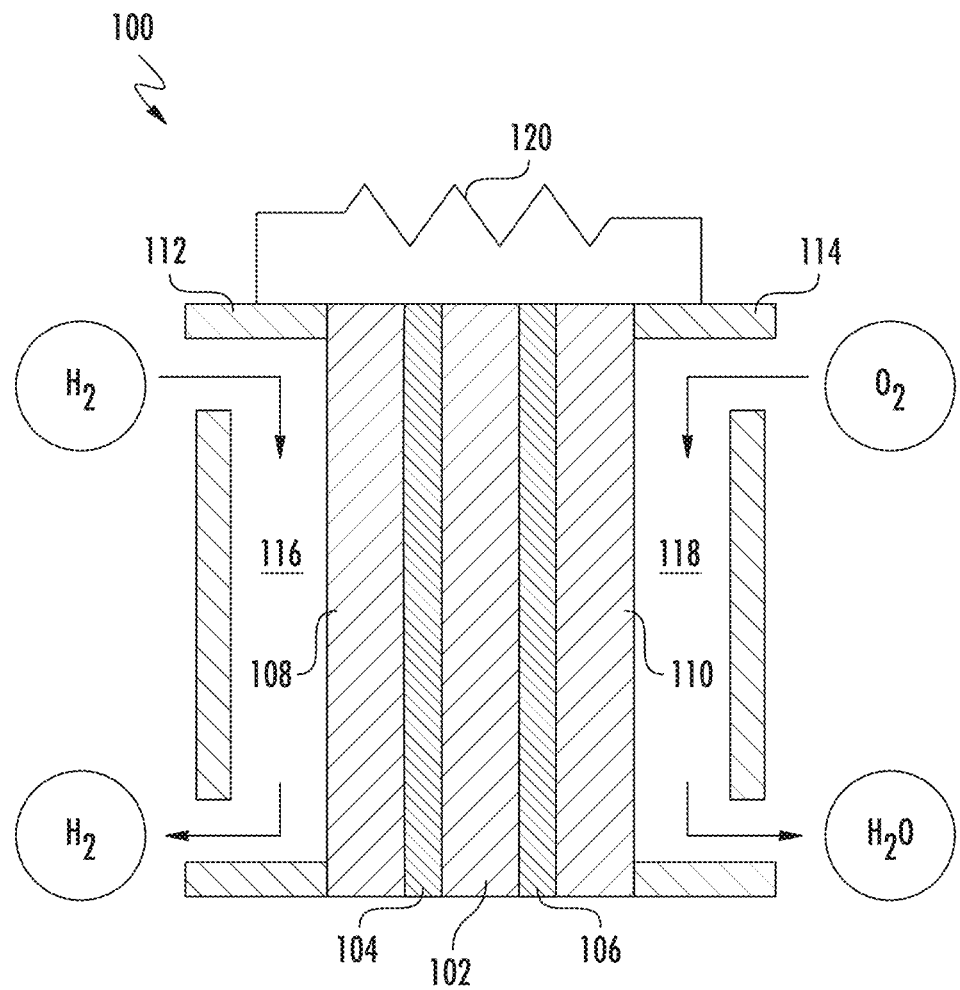
FIG. 1 illustrates a cross-sectional, schematic view of a fuel cell 100 according to embodiments described herein.

Embodiments described herein provide for nanoscale TMCs having improved support surface area with atomic level control of deposited Pt particles which are believed to provide synergetic effects of a Pt-TMC catalyst platform. Generally, vapor phase deposition, such as atomic layer deposition (ALD), offers control in the resulting Pt particle size and dispersion and, ultimately, increased catalyst activities. For example, ALD provides suitable control of deposited particles, on the molecular or atomic level, by tuning process parameters such as number of ALD cycles, as a result of sequential, self-limiting surface reactions.

For Pt ALD processes, it is believed that the island growth mechanism dominates the initial tens to hundreds of cycles due to stronger bonding between Pt atoms than bonding between Pt and other substrate surfaces. Embodiments described herein provide for ALD deposition of Pt nanoparticles onto phase-pure Mo$_2$C nanotubes that are synthesized via salt-flux method (10-15 nanometers in diameter, 1-2 microns in length). Embodiments also provide for tuning Pt nanoparticle size from atomic to about 3 nm via ALD. The Pt/Mo$_2$C nanocatalyst platform, among others described herein, is believed to provide for improved catalytic activity resulting from the synergetic effect of TMC supports for precious group metal (PGM) catalysts, such as platinum or the like. Pt ALD modified Mo$_2$C nanotubes (referred to hereinafter as Pt/Mo$_2$C) are also described with regard to utilization in a proton exchange membrane fuel cell (PEMFC).

Experimental
Synthesis of Metal Carbides

In one embodiment, Mo$_2$C nanotubes were synthesized via a salt flux approach. In this embodiment, 0.13 g of sodium chloride, 0.37 g of sodium fluoride, 0.05 g of multi-walled carbon nanotube (MWCNT), and 0.20 g of molybdenum powder (Sigma-Aldrich) were ground in a mortar. In one embodiment, the halide salts (NaCl and NaF), the MWCNTs, and the transition metal (molybdenum) are present in the mixture in a ratio of about 67:7:26, respectively.

Then, the mixture was placed in a crucible and moved to a tubular furnace. The furnace temperature was ramped to a temperature greater than 900° C. and heated at the temperature for a period of time of greater than about 10 hours. In one embodiment, the mixture was heated to a temperature of about 975° C. over a duration of 9.75 hours, stabilized at about 975° C. for about 14 hours, and then cooled to room temperature. While in the furnace, the mixture was kept in an inert environment. In one embodiment, the mixture is maintained in a flowing Argon environment. After the furnace temperature reached room temperature, the powder was removed and excessive salts were washed away by boiling and rinsing the mixture in deionized water. Finally, the Mo$_2$C powder was dried in air at a temperature of between about 25° C. and about 100° C., such as about 50° C. for a period of time between about 8 hours and about 16 hours. The resulting molybdenum carbide support formed according to the embodiments described about is phase pure and has a nanotube morphology. In one embodiment, the molybdenum carbide support nanotubes have a length of between about 1 micron and about 2 microns and a diameter of between about 10 nm and about 15 nm.

Pt was deposited onto molybdenum carbide via ALD using Platinum (IV) Trimethyl (methylcyclopentadienyl) (MeCpPtMe$_3$) as the platinum precursor and oxygen as the oxidant. In one embodiment, 15 Pt ALD cycles were utilized. In this embodiment, the resulting catalyst is referred to as 15 Pt/Mo$_2$C. In another embodiment, 50 Pt ALD cycles were utilized. In this embodiment, the resulting catalyst is referred to as 50 Pt/Mo$_2$C. In another embodiment, 100 Pt ALD cycles were utilized. In this embodiment, the resulting catalyst is referred to as 100 Pt/Mo$_2$C. The reactions were carried out in a rotating ALD reactor and the deposition temperature was maintained between about 100° C. and about 300° C., such as about 200° C., during deposition of the Pt on the Mo$_2$C support.

Generally, the rotating ALD reactor design is based on two concentric cylinders. The outer cylinder remains fixed and contains a series of slits. The slits can accept a wide range of modules that attach from the outside. The modules can easily move between the various slit positions and perform precursor dosing, purging, or pumping. The inner cylinder rotates with the substrate (Mo$_2$C support) and passes underneath the various spatially separated slits in the outer cylinder.

While the above referenced embodiments, in addition to subsequent characterization and results, relate to the Pt/Mo$_2$C catalyst platform, other and further catalyst platforms are contemplated. For example, improved salt flux techniques reduce reaction temperatures and can be utilized to form catalyst support materials in the nanometer regime. In addition, utilization of MWCNTs as a reactant is believed to further reduce diffusion distance and also provides a template for the ultimately formed carbide materials. Accordingly, metal carbide compounds produced utilizing low temperature salt flux techniques can maintain the nanowire morphology of the carbon nanotubes but increase in size to between about 15 nm and about 20 nm in diameter due to the incorporation of metal in the carbon lattice. The nano-carbides formed according to methodologies described hereinafter not only have a nanowire like shape but also have increased surface areas when compared to conventionally prepared metal carbides. Moreover, bimetallic carbides may be produced by utilizing two metal precursors in the salt flux reaction. Thus, it is contemplated that methods described herein provide for nano sized metal carbide materials with controllable characteristics, such as size, morphology, and composition.

In various examples, MWCNT's (<95% and average 6.6 nm diameter) may be mixed with a metal powder selected from one or more of chromium (99.5%), molybdenum (99.9%), tungsten (99.9%), vanadium (99.5%), niobium (99.8%) tantalum (99.9%), titanium (99.7%), zirconium (<99%), and hafnium (99.5%), all of which are commercially available from Sigma Aldrich. The MWCNT's and desired metal powder may be mixed with a LiCl—KCl—KF flux (LiCl:KCl:KF=58:41:1 wt %) in a glovebox, or other controlled environment apparatus, to limit exposure to oxidizing materials, such as oxygen. The mixture is then heated in an alumina boat at a temperature between about 400° C. and about 1050° C. for an amount of time between about 5 hours and about 12 hours in an Argon purged atmosphere. Once cooled, the mixture may be washed with water to dissolve the salt flux out of the reaction product. The resulting carbide reaction product may then be optionally centrifuged and dried.

More specifically, the carbide synthesis utilizes a molten salt flux as a reaction medium which is suitable for all group 4-6 metals. To synthesize carbide nanowires, a eutectic mixture of KCl and LiCl may be ground together with a mixture of MWCNTs and bulk metal powders. The combination of halide salts (KCl and LiCl) forms a molten/liquid reaction medium at low temperatures (e.g. below about 400° C.). KF salts may also be utilized in an amount of between about 1 wt % and about 5 wt % of the reaction medium to improve the reaction rate in certain embodiments. For all reactions, the ratio of metal to carbon is stoichiometric except for the tungsten and chromium systems where additional carbon is utilized. While single metal carbides are discussed in detail below, bimetallic metal carbides may also be formed by utilizing two metal powders in the reaction mixture. In this embodiment, the alloy composition of the bimetallic metal carbide may be controlled to form materials having desirable characteristics, such as improved surface area and the like. In another embodiment, trimetallic metal carbides may also be formed bu utilizing three metal powders in the reaction mixture. Similar to the bimetallic metal carbide materials, an alloy composition of the trimetallic metal carbide may be controlled to form materials having desirable characteristics.

Table 1 illustrates synthesis conditions utilized for single metal carbides formed utilizing the above described methods. Phases for each of the resulting metal carbides were determined by powder x-ray diffraction (XRD). TiC and TaC adopted the NaCl structure and had the following lattice constants a=4.137 Å and a=4.454 Å, respectively. $Nb_4C_3$ and $V_8C_7$ obtained ordered non-stoichiometric phases but both still possessed the NaCl parent structure with lattice constants of a=4.445 Å and a=8.330 Å, respectively. $VC_{1-x}$ is not stable with carbon content over $VC_{0.88}$ but forms an ordered phase with cubic symmetry at $V_8C_7$. When using a 1:1 ratio of metal to carbon, $Nb_4C_3$ forms but upon heating for 12 hr as opposed to 5 hr, the stoichiometric phase can be formed. A slight excess of carbon (1:1.1) can also force the reaction toward the stoichiometric phase. The lattice constant for NbC is a=4.47 Å, but is otherwise substantially identical to the non-stoichiometric phase. ZrC and HfC are also stoichiometric phases that adopt the NaCl structure.

$Cr_3C_2$ is an orthorhombic phase with lattice constants a=11.47 Å, b=5.53 Å, and c=2.82 Å and is less symmetric than the NaCl type structure observed for other carbides. In this phase, the metal atoms are not close packed and instead form edge sharing trigonal prisms with carbon at the center of the prism. WC also formed a non-NaCl type hexagonal structure where the W and C atoms form layered hexagonal substructures.

The nanotubes of the various carbide materials are believed to grow in diameter upon conversion from carbon to carbide with average diameters between about 15 nm and about 20 nm. It is believed that the nanowires vary in size and shape as a result of the different crystal structures and reaction temperatures, however, the overall morphology between all the carbides is substantially maintained. In addition, the wire-like morphology and interwoven nature of the carbides provide for multiple redundant electronic connections while still providing high surface area which is ideal for catalysis. For example, Brunauer-Emmet-Teller (BET) surface area measurements for the product carbides range from about 10 $m^2g^{-1}$ to about 50 $m^2g^{-1}$, while carbides formed from traditional synthesis methods typically result in BET surface areas below about 5 $m^2g^{-1}$.

Materials Characterization

Referring back to the $Pt/Mo_2C$ catalyst, the phases present in each sample (15, 50, 100) were determined by XRD using a Rigaku Smart Lab X-ray diffractometer (XRD) with Cu Kα radiation (λ=1.54060 Å). The d-spacings measured from XRD patterns were compared to the database of inorganic compound powders PDF2 to identify the crystalline phases present. X-ray photo spectroscopy (XPS) was carried out using a Kratos Axis Ultra DLD XPS with a monochromated Al K-alpha source under $10^{-10}$ torr vacuum. Survey scans were performed at 80 eV pass energy with an energy resolution of 0.5 eV and 3 sweeps. High resolution scans were performed at 40 eV pass energy with an energy resolution of 0.02 eV and 3 sweeps.

Pt mass loading was measured using atomic absorption spectroscopy (AAS) and inductively coupled plasma optical emission spectrometry (ICP-OES) techniques (when detectable). AAS was carried out by a Perkin Elmer AAS instrument. Flame technique was used with a wavelength of 265.95 nm, slit width of 0.7 nm, lamp current of 30 A, and 75 eV of energy. Calibration was performed using a zero intercept nonlinear model. Unknown sample solution for AAS was prepared by dissolving 50 mg of $Pt/Mo_2C$ in 3.5 ml aqua regia ($HNO_3$:HCl=1:3). 1000 mg/L Pt in 5% HCl (commercially available from Sigma-Aldrich) was used for calibration. ICP-OES analysis was performed to further

TABLE 1

| Metal | Temp (° C.) | Time (hr) | Carbon:metal | Phase formed |
|---|---|---|---|---|
| Titanium | 400-900 | 5 | 1:1 | TiC |
| Vanadium | 600-950 | 5 | 1:1 | $V_8C_7$ |
| Chromium | 950 | 5 | 1:1 | $Cr_3C_2$ |
| Zirconium | 850 | 5 | 1:1 | ZrC |
| Niobium | 800-950 | 5 | 1:1 | $Nb_4C_3$ |
| Niobium | 950 | 12 | 1:1 | NbC |
| Molybdenum | 950 | 12 | 1:2 | $Mo_2C$ |
| Hafnium | 750-950 | 5 | 1:1 | HfC |
| Tantalum | 750-950 | 5 | 1:1 | TaC |
| Tungsten | 1050 | 12 | 3:1 | WC | quantify the amount of Pt deposited on $Mo_2C$ from various numbers of ALD cycles by using a Perkin Elmer Optima 8300 instrument equipped with Perkin Elmer S10 auto sampler an WinLab 32 software. Samples for ICP-OES were prepared the same way as for AAS. Pt ICP standard (1000 ppm in 5 wt % HCl) was obtained from Fluka. 265.95 nm and 214.42 nm detection wavelengths were chosen for Pt.

High resolution transmission electron microscopy (HR-TEM) was used to characterize the morphology and Pt distribution on the carbide nanotubes under bright field (BF) mode with an FEI Tecnai F2 G20 S-Twin (S)TEM with an accelerating voltage of 200 kV. Pt nanoparticle size was calculated using ImageJ. BET (Brunauer-Emmett-Teller) surface area was measured by nitrogen physisorption at 77 K using a Micromeritics APAP 2020 with surface area analyzer.

Electrochemical Tests

Using a three-electrode system, cyclic voltammetry (CV) and linear sweep voltammetry (LSV) measurements were carried out in $N_2$ saturated 0.5M H2504 (pH=0) solution to evaluate the oxidation stability, HER activity of the $Mo_2C$ and $Pt/Mo_2C$ catalysts. As a baseline comparison, CV and LSV were also collected for commercial 20% Pt supported on a vulcan XC-72 (Johnson Matthey) catalyst under the same conditions (referred to as 20% Pt/C hereafter). Glassy carbon (3 mm diameter) was used as working electrode, with Pt wire as a counter electrode and Ag/AgCl saturated in 3 M NaCl as a reference electrode.

Catalyst ink was prepared by ultrasonically suspending 5 mg of catalyst in 2 mL of ethanol and 50 μL of 5 wt % Nafion® solution for 15 min. 10 μL of the suspended catalyst was spread on the working electrode and dried to obtain a thin active layer (with a loading of 0.35 mg catalyst $cm^{-2}$ on the disk). Potential was applied between the reference and the counter electrode while the current was measured between the counter and the working electrode via CompactStat e10800 potentiostat (commercially available from Ivium Technology). The 0.5M $H_2SO_4$ electrolyte solution was purged with $N_2$ for one hour prior to electrochemical testing. $N_2$ flow (0.2 L/min) was maintained above the electrolyte throughout the testing to eliminate $O_2$ from the environment.

Durability testing was carried out by constant potential electrolysis (CPE) at −69 mV vs. RHE for 48 hours in 0.1 M $HClO_4$ (pH=1), followed by potential cycling between −0.4 to 0.6V for 3000 cycles. Prior to CPE experiments, the electrolyte was purged with $N_2$ for 20 minutes. Catalyst ink for durability testing was prepared by sonicating 2.5 mg catalyst in 312.5 mL (18.2 MO ultrapure) water and 62.5 μL 5 wt % Nafion® solution (commercially available from Sigma Aldrich) for 30 minutes. The electrode was then dried at 50° C. for two hours.

Fuel Cell Fabrication and Testing

Membrane electrode assemblies (MEAs) were fabricated using ionomers, for example, sulfonated tetrafluoroethylene based co-polymer materials. One example of a suitable ionomer is Nafion® 212 (commercially available from DuPont). In one embodiment, the Nafion® 212 membrane was first boiled in 3% $H_2O_2$ for one hour, followed by one hour of boiling in deionized (DI) water, then one hour of boiling in 1 M $H_2SO_4$, and finally one hour of boiling in DI water. Carbon based macro and micro porous materials were utilized as a gas diffusion layer (GDL). In one embodiment, a SIGRACET® 10 BC carbon paper (commercially available from Ion Power) was used as a Gas Diffusion Layer (GDL). Catalyst inks were prepared by combining the desired catalyst, methanol (for 20% Pt/C) or ethanol (for $Pt/Mo_2C$), and Nafion® solution. 5% Nafion® ionomer solution (commercially available from DuPont) was added such that the Nafion® solids were 30% of the total mass of catalysts and Nafion® solids in the ink. An alcohol, such as methanol or ethanol, was added in an amount that was ten times the mass of catalyst in the ink. The ink was then sonicated for 20 minutes.

The gas diffusion electrode was prepared by painting the GDL, however, other catalyst application techniques are contemplated. The catalyst loading on the GDL was determined by measuring the weight of the empty GDL and the weight after depositing catalyst on the GDL by a microbalance (commercially available from Sartorius). The membrane with gas diffusion electrode on both sides was pressed using digital combo multi-purpose heat press (DC14, commercially available from GEO Knight & Co. Inc.). The pressing condition was maintained at 135° C. at 80 psig for 5 minutes. The MEA was tested using a fuel cell testing station (commercially available from Scribner Associates, Inc.) at 80° C. $H_2$ and $O_2$ flowrates were maintained at 0.2 liter/min with relative humidity of 100% for both gas streams. Before starting each polarization experiment, MEAs were conditioned by humidification at 80° C. for 3 hours, followed by holding the potential at 0.6 V for one hour. Sequentially, potential was altered between 0.7 and 0.5V (holding at each voltage for twenty minutes) for the total duration of twelve hours then holding at current of 1 ampere (A) for seven hours. The polarization experiments were performed with 100 $Pt/Mo_2C$ and 20% Pt/C on the anode side, while keeping 20% Pt/C on the cathode with Pt loading of 0.4 mg Pt $cm^{-2}$.

FIG. 1 illustrates a cross-sectional, schematic view of a fuel cell 100 according to embodiments described herein. In one embodiment, the fuel cell 100 is a PEMFC type fuel cell. The fuel cell 100 includes a proton exchange membrane 102, a first catalyst material layer 104 disposed on the proton exchange membrane 102, and a second catalyst material layer 106 disposed on the proton exchange membrane 102 opposite the first catalyst material layer 104. In one embodiment, the proton exchange membrane 102 is a sulfonated tetrafluoroethylene based co-polymer material, such as Nafion®.

The first catalyst material layer 104 and the second catalyst material layer 106 are disposed on opposite sides of the proton exchange membrane 102 by various application techniques, such as painting, stamping, immersion, or the like. In one embodiment, the catalyst material layers 104, 106 is the $Pt/Mo_2C$ materials described herein, such as the 15 $Pt/Mo_2C$, the 50 $Pt/Mo_2C$, or the 100 $Pt/Mo_2C$. It is also contemplated that other catalyst materials, such as transition metal carbides, may also be utilized for the catalyst material layers 104, 106. Suitable examples of such materials include TiC, $V_8C_7$, $Cr_3$, $C_2$, ZrC, $Nb_4C_2$, NbC, HfC, TaC, WC, and combinations thereof. Each of the aforementioned materials may be formed according to the methods described herein.

A first gas diffusion layer 108 is coupled to the proton exchange membrane 102 such that the first catalyst material layer 104 is disposed between the proton exchange membrane 102 and the first gas diffusion layer 108. A second gas diffusion layer 110 is coupled to the proton exchange membrane 102 such that the second catalyst material layer 106 is disposed between the proton exchange membrane 102 and the second gas diffusion layer 110. In one embodiment, the gas diffusion layers 108, 110 may be carbon based macro and/or micro porous materials, such as SIGRACET® 10 BC.

An anode 112 is coupled to the first gas diffusion layer 108 opposite the proton exchange membrane 102 and the first catalyst material layer 104. A cathode 114 is coupled to the second gas diffusion layer 110 opposite the proton exchange membrane 102 and the second catalyst material layer 106. In one embodiment, the anode 112 and the cathode 114 are formed from conductive materials, such as metallic materials and graphite material or the like.

In operation, hydrogen fuel is delivered to and flowed through a flow channel 116 adjacent the anode 112. An oxidant (oxygen or air) is delivered to and flowed through a flow channel 118 adjacent the cathode 114. At the anode 112, the hydrogen traverses the first gas diffusion layer 108 and the first catalyst material layer 104 causes the hydrogen to split into positive hydrogen ions (protons) and negatively charged electrons.

The proton exchange membrane 102 allows the positively charged ions to pass through toward the cathode 114. The negatively charged electrons are rejected by the proton exchange membrane 102 and travel along a circuit 120 to the cathode 114, creating an electrical current. At the cathode 114, the electrons and positively charged hydrogen ions combine with oxygen to form water which flows out of the fuel cell 100.

Characterization of $Mo_2C$ and $Pt/Mo_2C$ Nanotube and Pt Quantification

Figure 2:
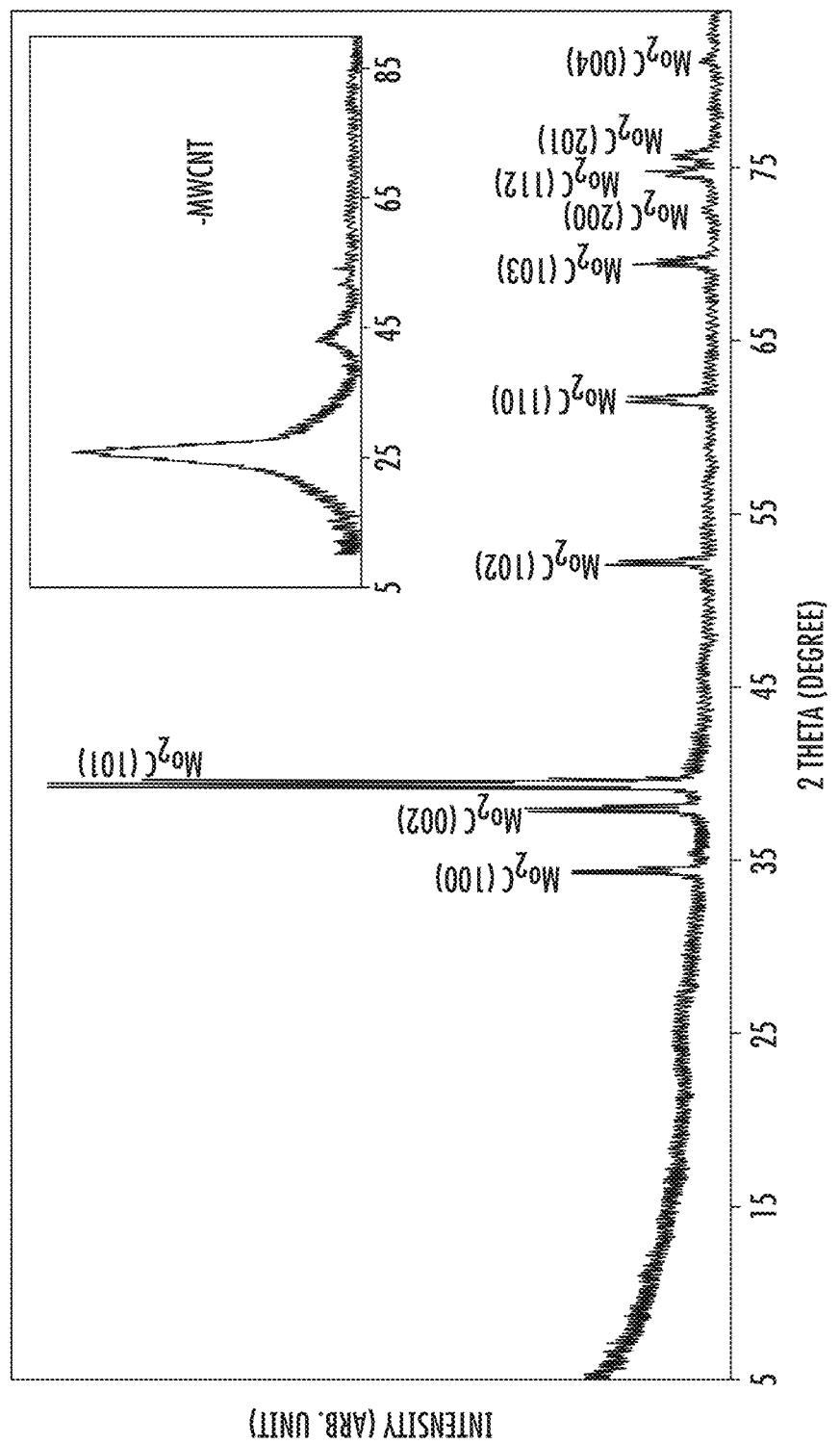
FIG. 2 illustrates x-ray diffraction of bare $Mo_2C$ and MWCNTs (inset) according to embodiments described herein.

FIG. 2 illustrates x-ray diffraction of bare $Mo_2C$ and MWCNTs (inset) according to embodiments described herein. The X-ray diffraction (XRD) pattern of bare $Mo_2C$ samples showed peak positions and relative intensity accurately corresponding to hexagonal $Mo_2C$ (also referred as β-$Mo_2C$). Comparison between the XRD patterns of MWCNTs (FIG. 2 inset) and $Mo_2C$ indicates the amount of unreacted MWCNTs (if present) is beyond the typical detection limit for XRD (~2%). It should also be mentioned that no significant peak from unreacted Mo was observed. In addition, it is noted that the starting materials for ALD deposition processes are phase-pure β-$Mo_2C$. As such, there is less than 6.4% amorphous carbon in all $Mo_2C$ samples used for Pt ALD.

XRD of 100 Pt/$Mo_2C$ shows no extra peak related to Pt crystalline phase indicating Pt crystalline dimension is beyond the typical detection limit for XRD. However, a slight peak shift was observed for the $Mo_2C$ peaks, implying deposition of Pt nanoparticles indeed changed the lattice constants of $Mo_2C$ support.

Figure 3A:
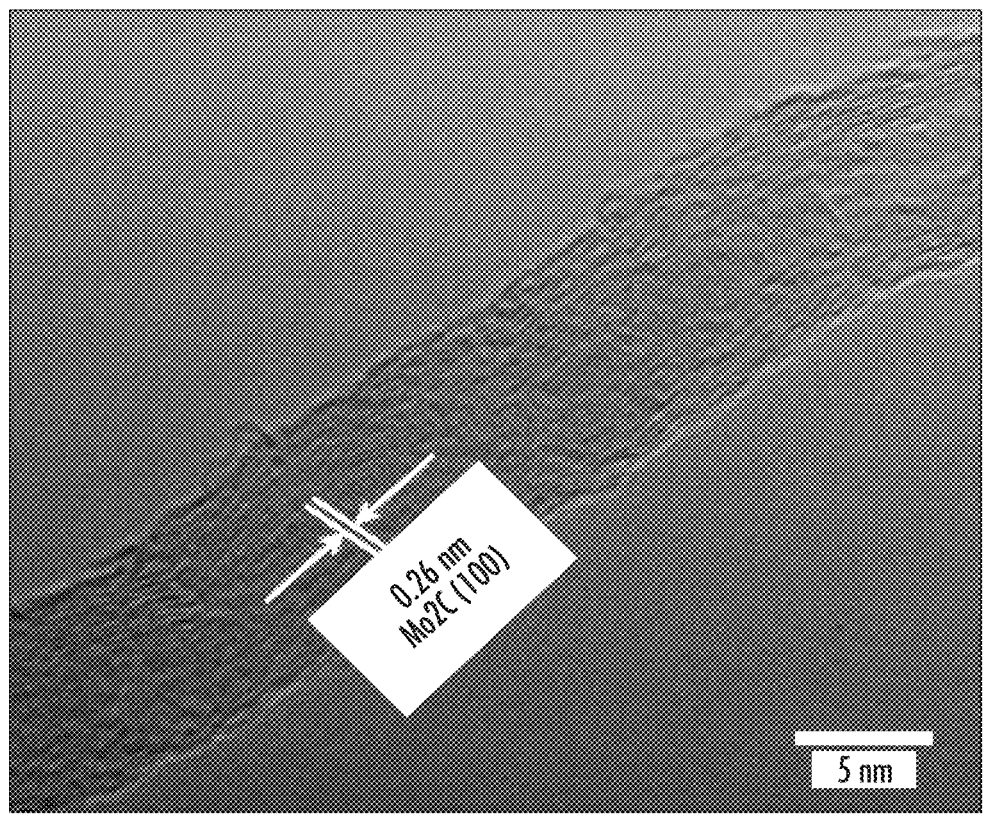
FIG. 3(a) illustrates a high resolution transmission electron spectroscopy (HRTEM) image of a bare $Mo_2C$ (100) nanotube with lattice spacing according to embodiments described herein.
Figure 3B:
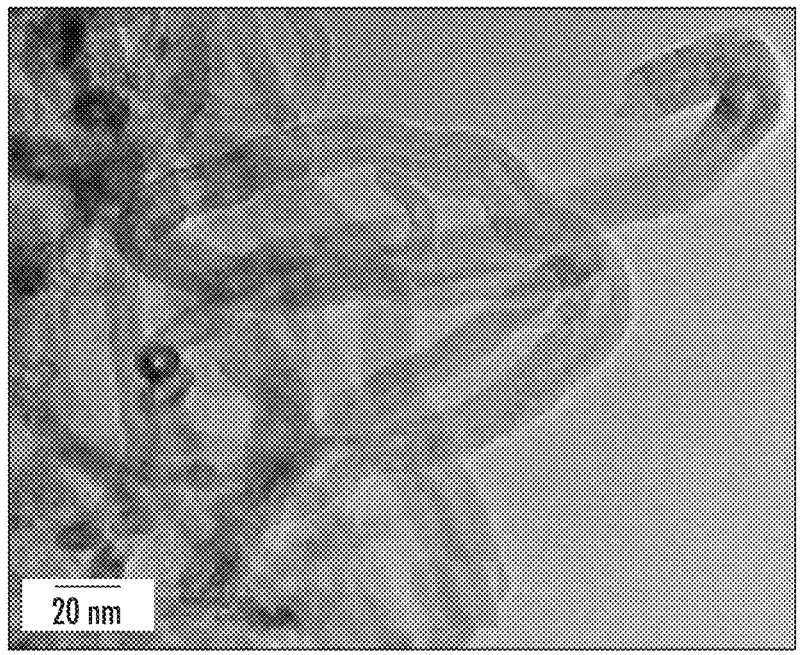
FIG. 3(b) illustrates an HRTEM image of 15 $Pt/Mo_2C$ according to embodiments described herein.
Figure 3C:
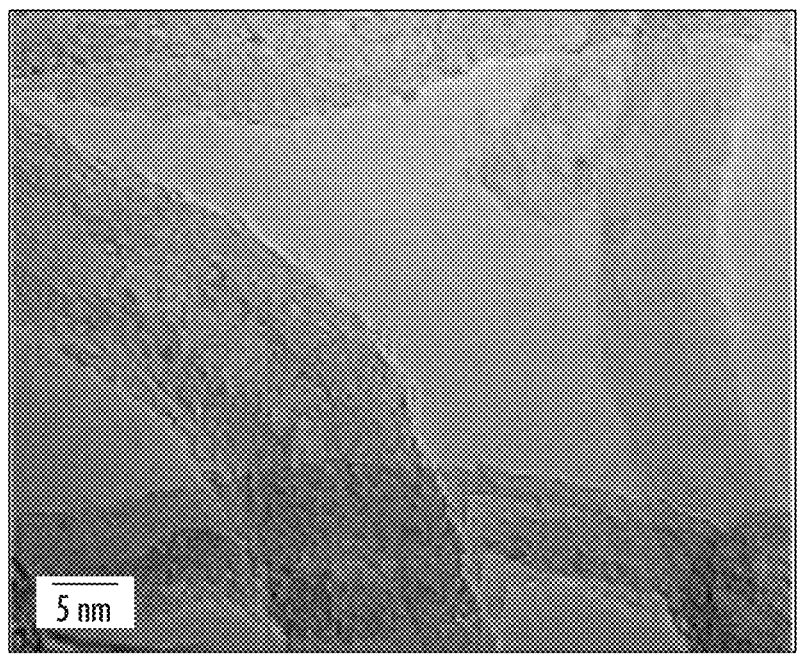
FIG. 3(c) illustrates a close up of the image of FIG. 3(b) according to embodiments described herein.
Figure 3D:
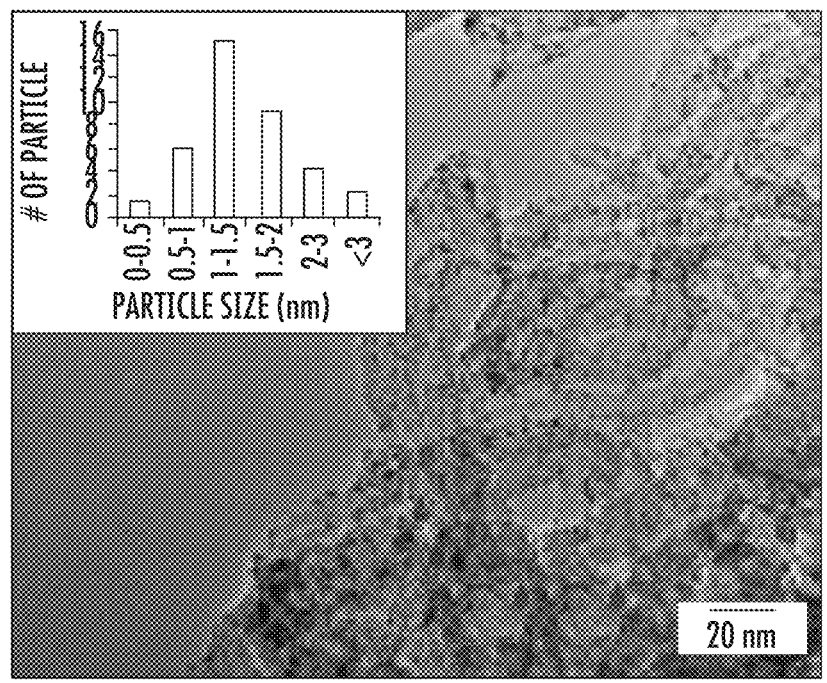
FIG. 3(d) illustrated an HRTEM image of 50 $Pt/Mo_2C$ according to embodiments described herein.
Figure 3E:
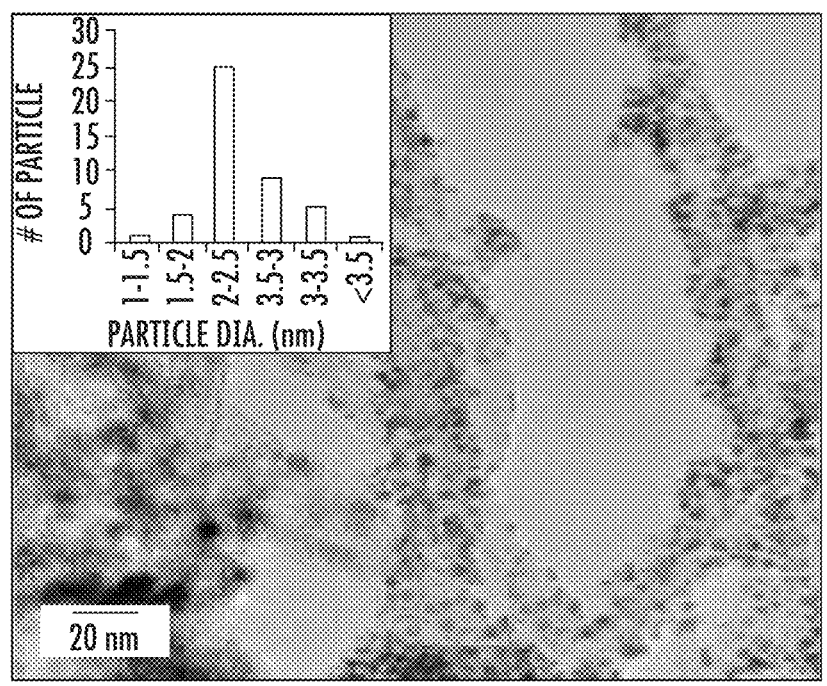
FIG. 3(e) illustrates an HRTEM image of 100 $Pt/Mo_2C$ according to embodiments described herein.

FIG. 3(a) illustrates a high resolution transmission electron spectroscopy (HRTEM) image of a bare $Mo_2C$ (100) nanotube with lattice spacing. The lattice fringes of $Mo_2C$ are in the direction of (100) plane with spacing of 0.26 nm. FIG. 3(b) illustrates an HRTEM image of 15 Pt/$Mo_2C$. FIG. 3(c) illustrates a close up of the image of FIG. 3(b). FIG. 3(d) illustrated an HRTEM image of 50 Pt/$Mo_2C$. FIG. 3(e) illustrates an HRTEM image of 100 Pt/$Mo_2C$.

Different numbers of ALD cycles resulted in the desired island growth mechanism of Pt with a narrow distribution of particle sizes (FIGS. 3 (b), (c), (d) and (e)). For the 15 Pt/$Mo_2C$ sample, Pt particles were barely discernible on the nanotube (FIGS. 3(b) and 3(c)). In contrast, samples of 50 and 100 Pt/$Mo_2C$ showed significantly increased nanoparticle density and size, with most Pt particle sizes being 1.5 nm and 2.5 nm for 50 Pt/$Mo_2C$ and 100 Pt/$Mo_2C$, respectively (FIGS. 3(d) and 3(e)). It should be noted that the atomic radius of Pt is about 0.135 nm.

Figure 4A:
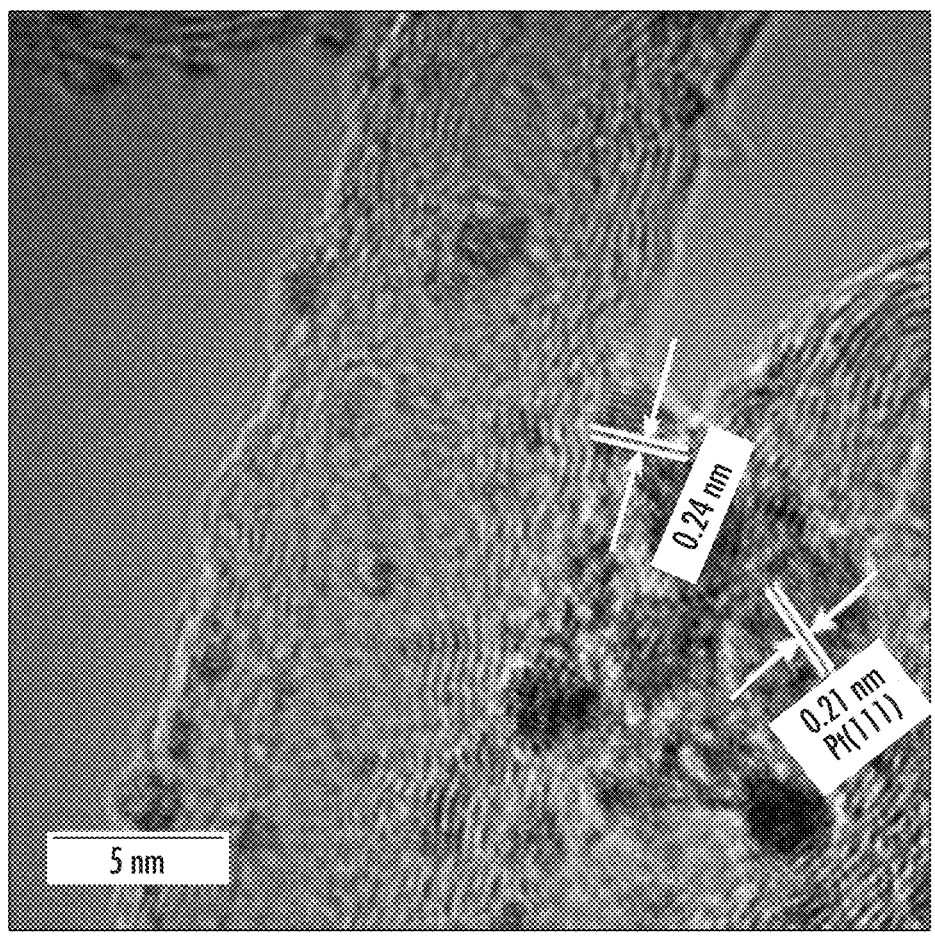
FIG. 4(a) illustrates lattice fringe analysis of HRTEM images of 50 $Pt/Mo_2C$ according to embodiments described herein.
Figure 4B:
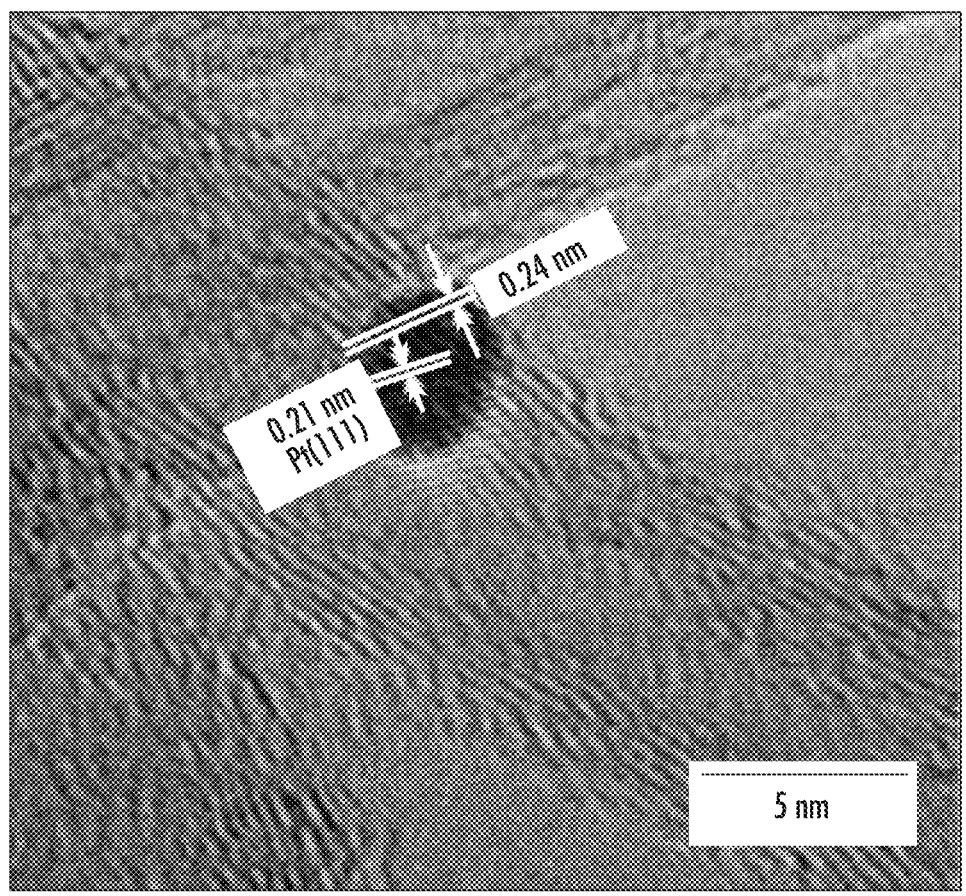
FIG. 4(b) illustrates lattice fringe analysis of HRTEM images of 100 $Pt/Mo_2C$ according to embodiments described herein.
Figure 4C:
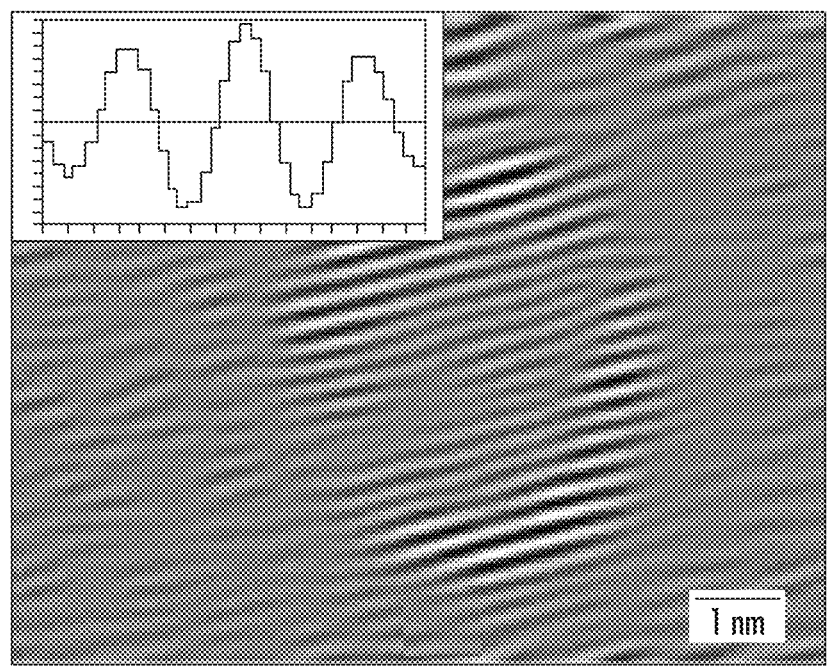
FIGS. 4(c) and 4(d) illustrate the inverse fourier transform of FIG. 4(b) according to embodiments described herein.
Figure 4D:
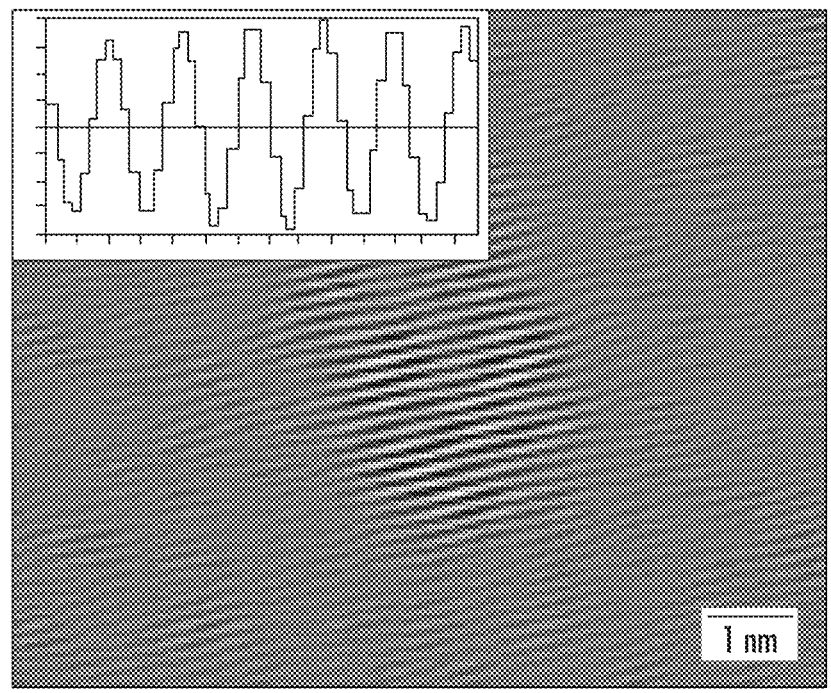

FIG. 4(a) illustrates lattice fringe analysis of HRTEM images of 50 Pt/$Mo_2C$. FIG. 4(b) illustrates lattice fringe analysis of HRTEM images of 100 Pt/$Mo_2C$. FIGS. 4(c) and 4(d) illustrate the inverse fourier transform of FIG. 4(b). The lattice fringe analysis in FIG. 4(a) illustrates that the lattice spacing inside a relatively bigger Pt particle is around 0.21 nm for 50 Pt/$Mo_2C$ samples, which corresponds to the inter planar distance of Pt (111), while it is 0.24 nm for smaller particles. Interestingly, for 100 Pt/$Mo_2C$ samples in particles with sizes ranging 3-4 nm it can be seen that lattice spacing increases within one particle from the center to edge (FIG. 4(b)).

Using inverse fourier transform, the lattice spacing is found to be 0.21 nm near the center (FIGS. 4(c)) and 0.24 nm near the edges of Pt particles (FIG. 4(d)). With the lattice spacing of bare $Mo_2C$ nanotube at 0.26 nm (FIG. 3(a)) and that of Pt (111) being 0.21 nm, it is believed that the Pt lattice was more stretched for smaller Pt nanoparticles and near the edge, possibly due to stronger interaction between Pt and $Mo_2C$ lattices. As Pt particles grow in both horizontal and vertical direction, the strain between the Pt lattice on the top and $Mo_2C$ support decreases, resulting in lattice spacing of 0.21 nm near the center of bigger Pt particles.

Figure 5A:
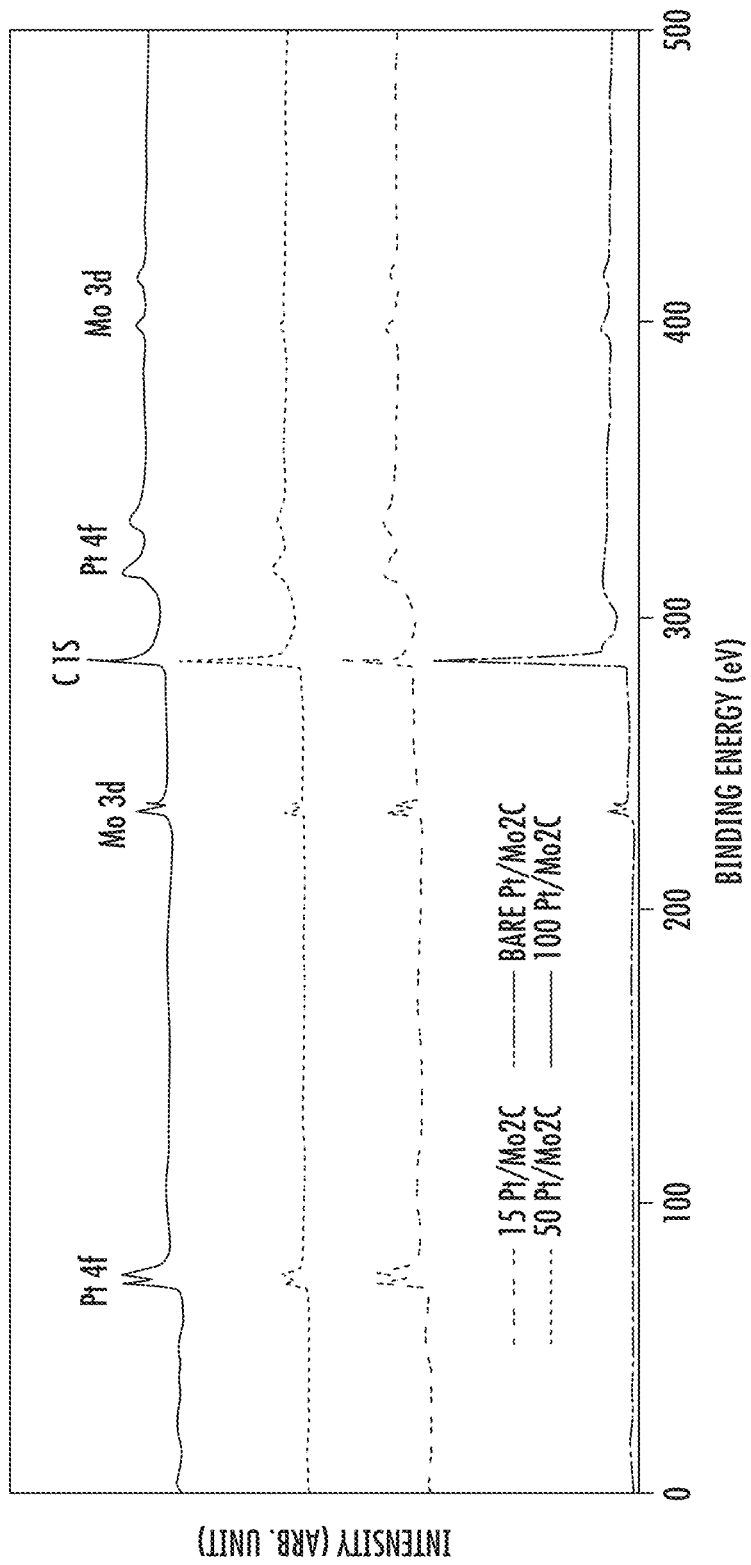
FIG. 5(a) illustrates XPS data of bare $Mo_2C$, 15 $Pt/Mo_2C$, 50 $Pt/Mo_2C$, and 100 $Pt/Mo_2C$ according to embodiments described herein.
Figure 5B:
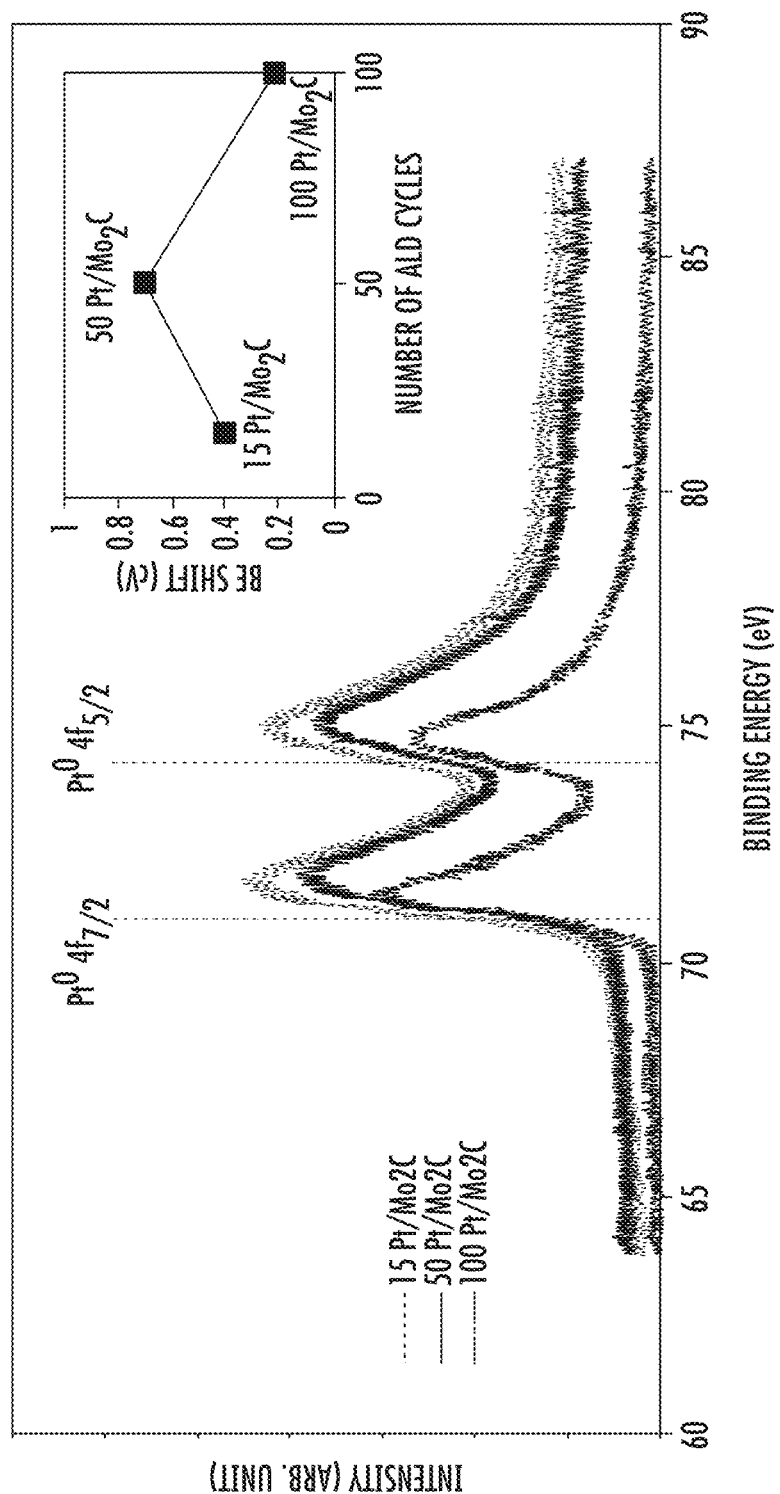
FIG. 5(b) illustrates a detailed view of the Pt 4f spectra of FIG. 5(a) and the inset of FIG. 5(b) is the binding energy shift vs. number of ALD cycles according to embodiments described herein.

FIG. 5(a) illustrates XPS data of bare $Mo_2C$, 15 Pt/$Mo_2C$, 50 Pt/$Mo_2C$, and 100 Pt/$Mo_2C$. FIG. 5(b) is a detailed view of the Pt 4f spectra of FIG. 5(a) and the inset of FIG. 5(b) is the binding energy shift vs. number of ALD cycles. Further surface characterization using XPS confirmed the presence of Pt on all ALD modified Pt/$Mo_2C$ samples. The binding energies (BE) were calibrated against C1S (284.5 eV). Shown in FIG. 5(b) are the high-resolution XPS of Pt 4f spectra indicating a binding energy shift between Pt particles and $Mo_2C$ nanotube support and, consequently, electron transfer from Pt to $Mo_2C$. For 100 Pt/$Mo_2C$ samples, the BE shifted about 0.5 eV from $Pt^0$ state, while 0.74 and 1.0 eV shifts from $Pt^0$ were observed for 15 and 50 Pt/$Mo_2C$ samples, respectively.

In other words, BE shift with increasing particle size has a volcano profile (FIG. 5(b) inset). BE shift decrease from 50 Pt/$Mo_2C$ to 100 Pt/$Mo_2C$ as Pt particle size increased apparent, even with particle sizes smaller than 2 nm. The volcano profile of BE shift vs particle size is also observed when particle size of 100 Pt/$Mo_2C$ was reduced with time by temporal argon depth profiling on 100 Pt/$Mo_2C$. The volcano profile observed in three discrete Pt/$Mo_2C$ samples of different sizes and the temporal particle size decrease suggest that particle size is influential for BE shift.

Electrochemical Characterization of Pt/$Mo_2C$

To probe activity of the Pt/$Mo_2C$ samples on the basis of Pt mass loading, a mass percentage of Pt in 50 Pt/$Mo_2C$ and 100 Pt/$Mo_2C$ samples from the MeCpPtMe3/O2 precursor system were quantified by AAS and ICP-OES and summarized in Table 2.

TABLE 2

| Sample | Pt wt % by ICP-OES | Pt wt % by AAS |
|---|---|---|
| 100 ALD cycle Pt/$Mo_2C$ | 4.4% | 3.67% |
| 50 ALD cycle Pt/$Mo_2C$ | 1.07% | — |

Figure 6B:
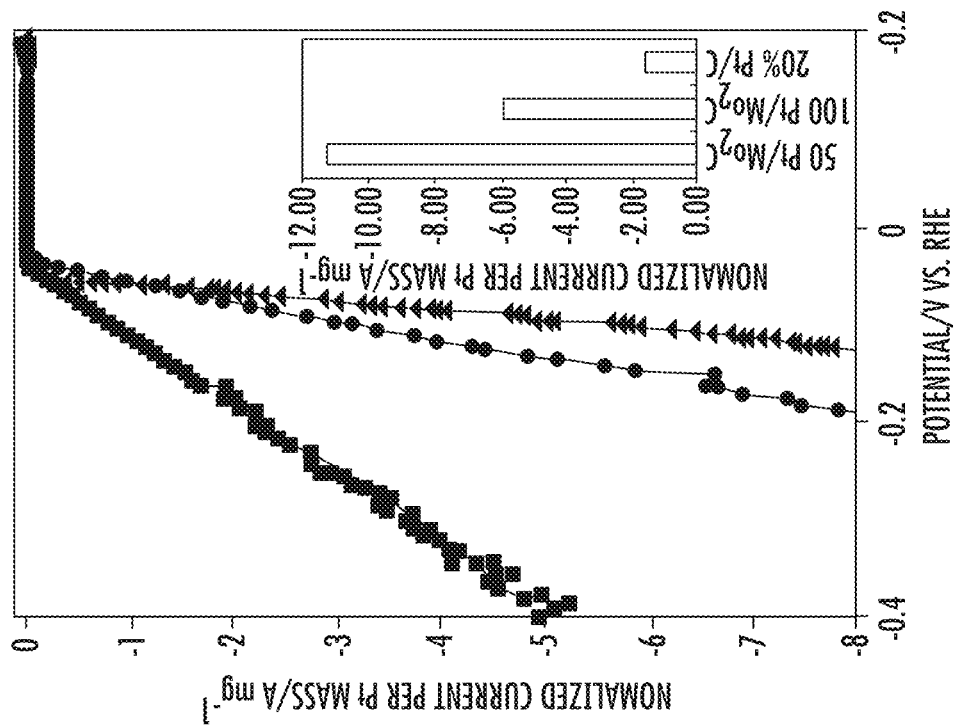
FIG. 6(b) illustrates the LSV of 100 Pt/Mo$_2$C, 50 Pt/Mo$_2$C, and 20% Pt/C per mass of Pt and normalized current per Pt mass at −144 mV vs RHE is shown in the inset of FIG. 6(b) according to embodiments described herein.
Figure 6A:
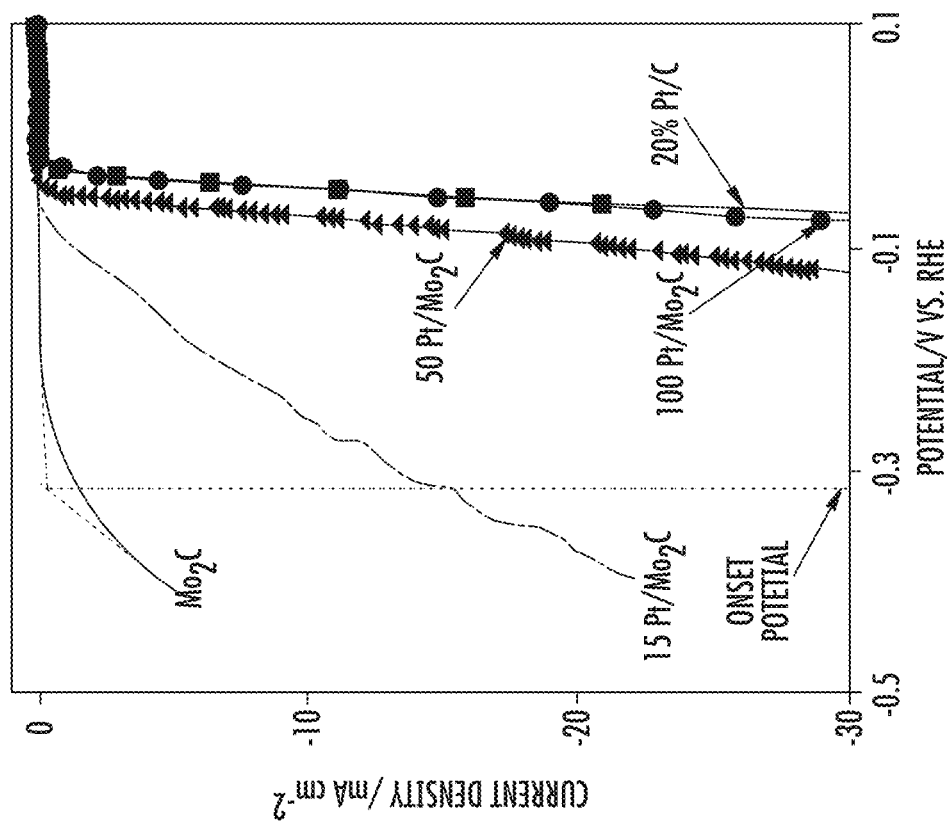
FIG. 6(a) illustrates linear sweep voltammograms (LSV) of 100 $Pt/Mo_2C$, 50 $Pt/Mo_2C$, 15 $Pt/Mo_2C$, 20% Pt/C, and $Mo_2C$ according to embodiments described herein.

FIG. 6(a) illustrates linear sweep voltammograms (LSV) of 100 Pt/$Mo_2C$ (15.4 μg Pt $cm^{-2}_{disk}$), 50 Pt/$Mo_2C$ (3.75 μg Pt $cm^{-2}_{disk}$), 15 Pt/$Mo_2C$ (Pt loading was below detection limit of ICP or AAS), 20% Pt/C (70 μg Pt $cm^{-2}_{disk}$), and $Mo_2C$ with a scan rate of 2 mV $s^{-1}$ in $N_2$ saturated $H_2SO_4$ solution. FIG. 6(b) illustrates the LSV of 100 Pt/$Mo_2C$, 50 Pt/$Mo_2C$, and 20% Pt/C per mass of Pt. Normalized current per Pt mass at −144 mV vs RHE is shown in the inset of FIG.

Figure 6C:
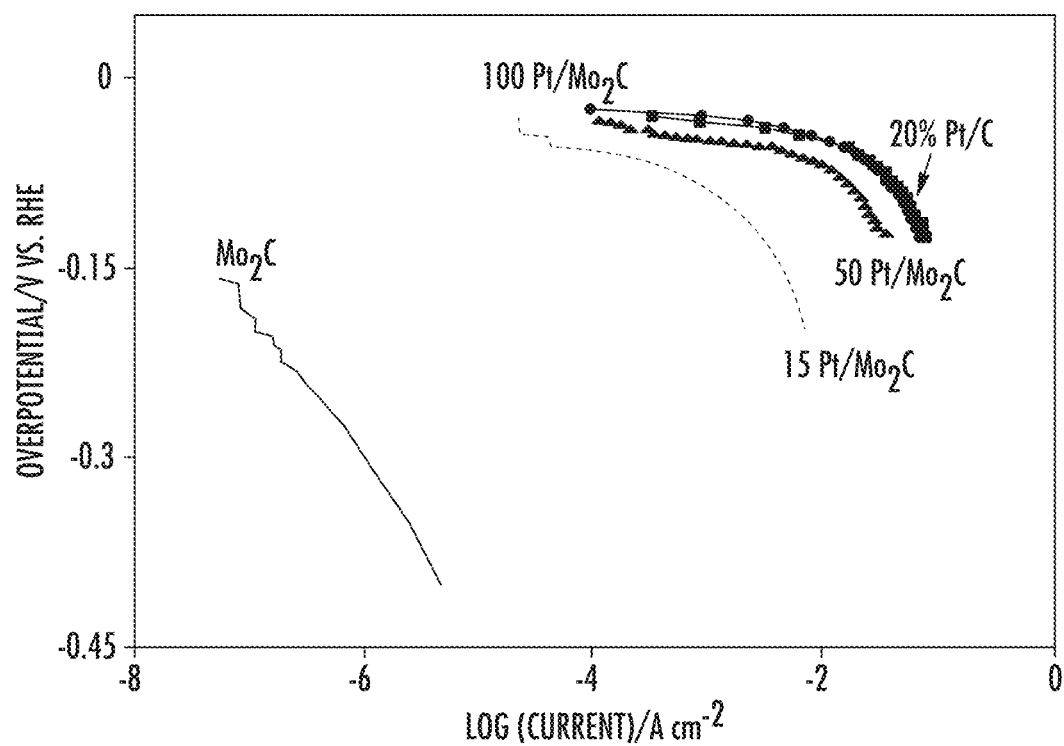
FIG. 6(c) illustrates Tafel plots of the materials of FIG. 6(a) using the LSV data shown in FIG. 6(a) according to embodiments described herein.

6(b). FIG. 6(c) illustrates Tafel plots of the materials of FIG. 6(a) using the LSV data shown in FIG. 6(a).

Linear sweep voltammetry (LSV) was performed to characterize the HER activity of Pt/Mo$_2$C catalysts fabricated using different numbers of ALD cycles. The HER onset potential was calculated using tangents of the LSV curves (FIG. 6(a)). Table 2 summarizes the onset potentials for all the samples. Comparison among the catalysts revealed that the onset potential for bare Mo$_2$C nanotubes (−0.32 V vs. RHE) is significantly higher than all the Pt/Mo$_2$C samples. HER activity increased with the increase in number of Pt ALD cycles, with 100 Pt/Mo$_2$C showing HER activity comparable to 20% Pt/C for the total ink volume.

As shown in FIG. 6(b) inset, at −144 mV overpotential 50 Pt/Mo$_2$C produced six times higher current than 20% Pt/C and two times higher than 100 Pt/Mo$_2$C. It should be noted that LSV of 15 Pt/Mo$_2$C sample is not presented since the Pt loading is under ICP-AES detection limit. Tafel plots of five catalysts are presented in FIG. 6(c), including Mo$_2$C nanotube, 15 Pt/Mo$_2$C, 50 Pt/Mo$_2$C, and 100 Pt/Mo$_2$C as well as commercially available 20% Pt/C samples.

Table 4 illustrates TAFEL slope and exchange current density of the various catalysts described herein

TABLE 4

| Sample | Slope (−mV vs. RHE) | Potential Range (−mV vs. RHE) | Exchange Current Density ($\log(i_0)$(A cm$^{-2}_{disk}$)) |
|---|---|---|---|
| 20% Pt/C | −32 | 40-80 | −3.62 |
| 100 ALD cycle Pt/Mo$_2$C | −34.7 | 40-80 | −3.52 |
| 50 ALD cycle Pt/Mo$_2$C | −33.1 | 40-80 | −4.14 |
| 15 ALD cycle Pt/Mo$_2$C | −59.7 | 120-300 | −4.48 |
| Bare Mo$_2$C | −124 | 150-400 | −8.50 |

Tafel slope and exchange current density were calculated by fitting the linear region of the plot in the following Tafel equation:

$$\eta = b\log j + a$$

with η being the overpotential, j the current density, b the Tafel slope and a the intercept of the plot. Exchange current density, j$_0$, was calculated by setting overpotential η to zero using the above equation. The reported current densities (mA cm$^{-2}$) in FIGS. 6(a), 6(b), and 6(c) are calculated using the disk area of the working electrode. Among the tested catalysts, Mo$_2$C has a slope of 124 mV/dec (FIG. 6(c) and Table 4), suggesting that the HER follows the Volmer-Heyvorski mechanism (Volmer: $H^+ + e^- \rightarrow H_{ad}$, Heyvorski: $H_{ad} + H^+ + e^- \rightarrow H_2$).

In contrast, all ALD Pt modified Mo$_2$C samples showed significant improvement in HER activity relative to the unmodified Mo$_2$C. Specifically, the 100 Pt/Mo$_2$C samples demonstrated comparable slope and exchange current density to 20% Pt/C, while the 50 Pt/Mo$_2$C showed lower HER activity than 20% Pt/C. The Tafel slopes of 50 Pt/Mo$_2$C and 100 Pt/Mo$_2$C samples indicate that the HER follows the Volmer-Tafel mechanism (Volmer: $H^+ + e^{31} \rightarrow H_{ad}$, Tafel: $H_{ad} + H_{ad} \rightarrow H_2$), with the rate-determining step being the hydrogen adsorption (the Tafel reaction step). The Tafel slope of 15 Pt/Mo$_2$C indicates that the HER on the 15 Pt/Mo$_2$C catalyst follows the Volmer-Heyvorski mechanism with the Heyvorski mechanism being the rate limiting step.

Figure 7A:
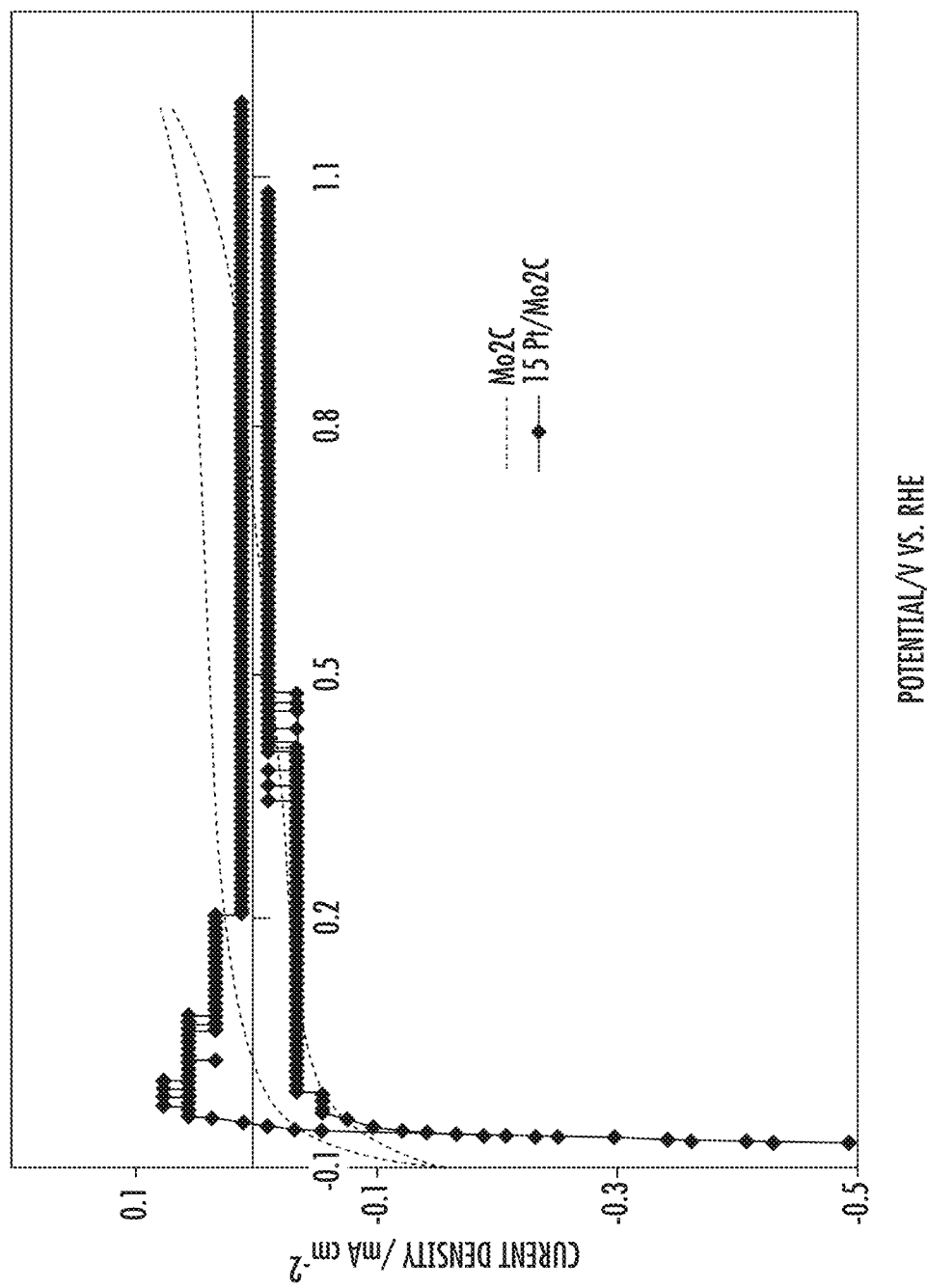
FIG. 7(a) illustrates cyclic voltammograms (CV) of 15 Pt/Mo$_2$C and bare Mo$_2$C according to embodiments described herein.
Figure 7B:
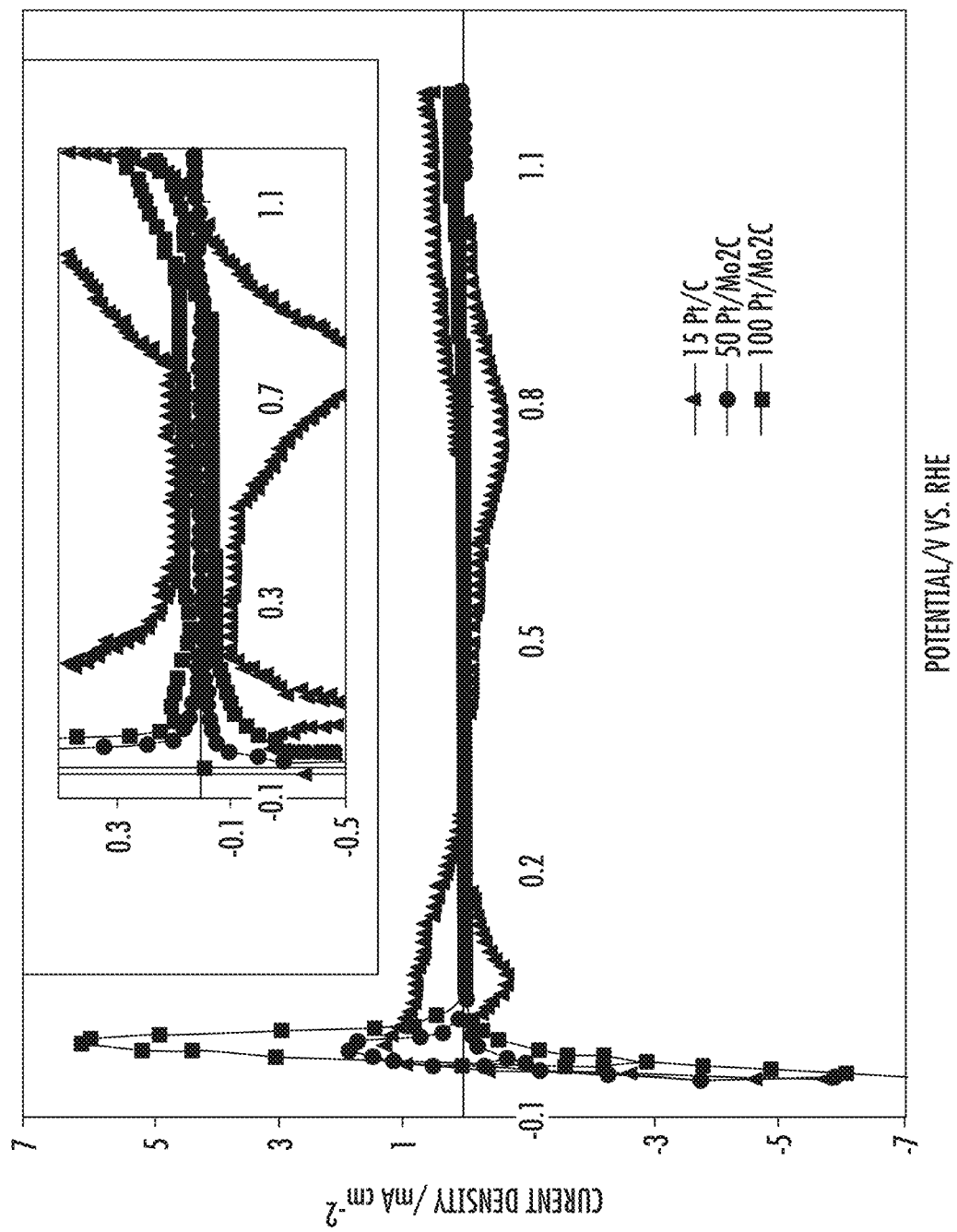
FIG. 7(b) illustrates cyclic voltammograms of 50 Pt/Mo$_2$C, 100 Pt/Mo$_2$C, Pt/Mo$_2$C, and 20% Pt/C according to embodiments described herein.

FIG. 7(a) illustrates cyclic voltammograms (CV) of 15 Pt/Mo$_2$C (Pt loading was below the detection limit of ICP or AAS) and bare Mo$_2$C. FIG. 7(b) illustrates cyclic voltammograms of 50 Pt/Mo$_2$C (3.75 μg Pt cm$^{-2}_{disk}$), 100 Pt/Mo$_2$C (15.4 μg Pt cm$^{-2}_{disk}$), Pt/Mo$_2$C, and 20% Pt/C (70 μg Pt cm$^{-2}_{disk}$) with a scan rate of 5 mV s$^{-1}$ in 0.5M H$_2$SO$_4$. Cyclic voltammetry (CV) of the 15 Pt/Mo$_2$C, 50 Pt/Mo$_2$C and 100 Pt/Mo$_2$C samples was used to further characterize activity. FIG. 7(a) illustrates CV curves of Mo$_2$C and 15 Pt/Mo$_2$C catalysts with anodic current defined to be positive. The CV data was collected between −0.103 to 1.2 V vs. RHE for 15 Pt/Mo$_2$C and bare Mo$_2$C and −0.053 to 1.2V for samples with higher Pt loading at scan rate of 5 mV s$^{-1}$. The 10th cycle is illustrated in FIG. 7(a).

It is contemplated that no Pt-like behavior was observed in the CV curve for Mo$_2$C. In contrast, after 15 cycles of Pt ALD, CV of the modified Mo$_2$C nanotubes (15 Pt/Mo$_2$C) demonstrated strong Pt-like features. In addition, the CV curve of Mo$_2$C showed an increase of anodic current density from 0.1V (referred to as oxidation onset potential) and onwards. On the reverse scan, no reduction current was observed, indicating irreversible oxidation of the Mo$_2$C surface. Unexpectedly, the 15 Pt/Mo$_2$C sample did not show any noticeable oxidation onset potential in the entire voltage range (−0.103-1.2V), thus, demonstrating excellent stability towards oxidation with the atomic level Pt modification.

Comparison between the CV curves of 50 Pt/Mo$_2$C, 100 Pt/Mo$_2$C and 20% Pt/C (FIG. 7(b)) revealed similar HER onset potential and hydrogen oxidation peaks, with 50 Pt/Mo$_2$C and 100 Pt/Mo$_2$C showing a single HOR peak current density one and half and five times higher than commercially avilable 20% Pt/C, respectively. The single HOR peak for 50 and 100 Pt/Mo$_2$C is consistent with Pt (111) lattice spacing observed in FIG. 4, while multiple peaks were shown for 20% Pt/C sample with Pt being polycrystalline in phase.

To further characterize HER activity, Electrochemically Active Surface Area (ECSA) was calculated for hydrogen under potential adsorption (H$_{upd}$) region using CV curves in FIGS. 7(b). ECSA for 50 Pt/Mo$_2$C and 100 Pt/Mo$_2$C are 51.76 m$^2$ g$^{-1}$ and 40.52 m$^2$ g$^{-1}$ of Pt, which are 90% and 49% higher than that of 20% Pt/C (27.25 m$^2$ g$^{-1}$ Pt), respectively. Given that 20% Pt/C has significantly higher BET surface area (158.59 m$^2$ g$^{-1}$ catalyst) than 100 Pt/Mo$_2$C (25.68 m$^2$ g$^{-1}$ catalyst) and 50 Pt/Mo$_2$C (20.71 m$^2$ g$^{-1}$), the higher ECSA value per Pt mass from Pt/Mo$_2$Cs indicates that the synergistic effect between the Pt and Mo$_2$C nanotube significantly increased the number of active sites. It is believed that the strong interaction between Pt nanoparticle and Mo$_2$C nanotube support, as observed in XPS BE shift and lattice spacing changes after depositing Pt nanoparticles, may have resulted in the increased oxidation stability.

Since the reaction rate of HER depends on hydrogen binding energy (HBE), it is believed that catalysts with the enhanced HBE provide for improved hydrogen evolution reactivity. It is further believed that the enhancement in electrocatalytic activity in Pt ALD modified Mo$_2$C catalysts to the results from the electronic structure change. The strong interaction between both the Pt and the Mo$_2$C nanotube support, resulting from ALD deposition process, provides for improved hydrogen binding energy (HBE).

Catalyst Durability

Figure 8A:
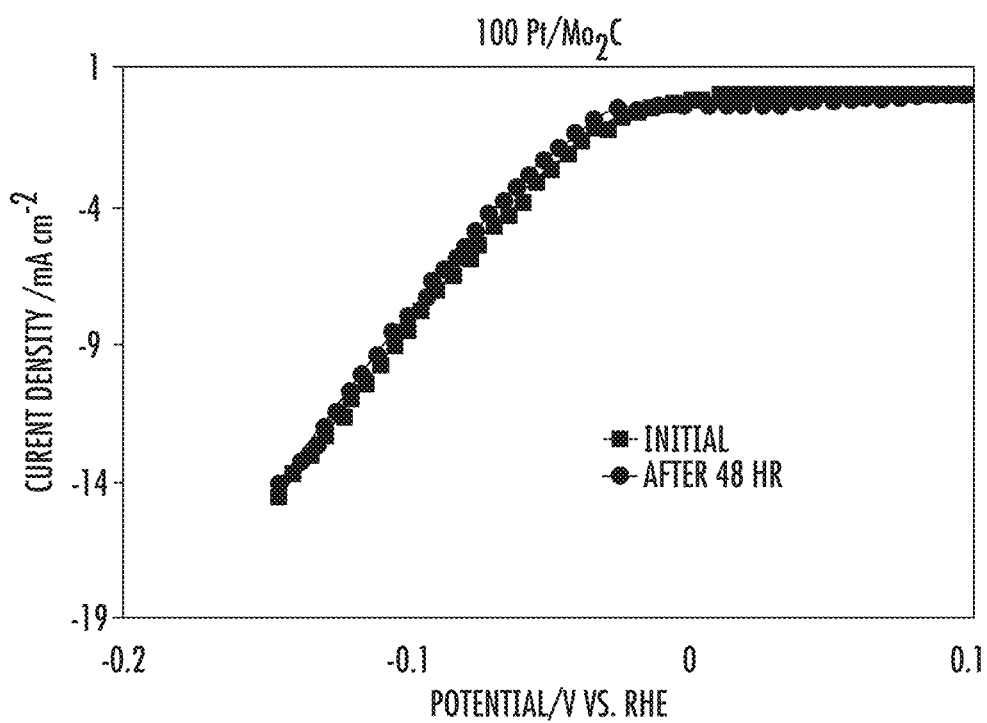
FIG. 8(a) illustrates durability tests with LSVs of 100 Pt/Mo$_2$C according to embodiments described herein.
Figure 8B:
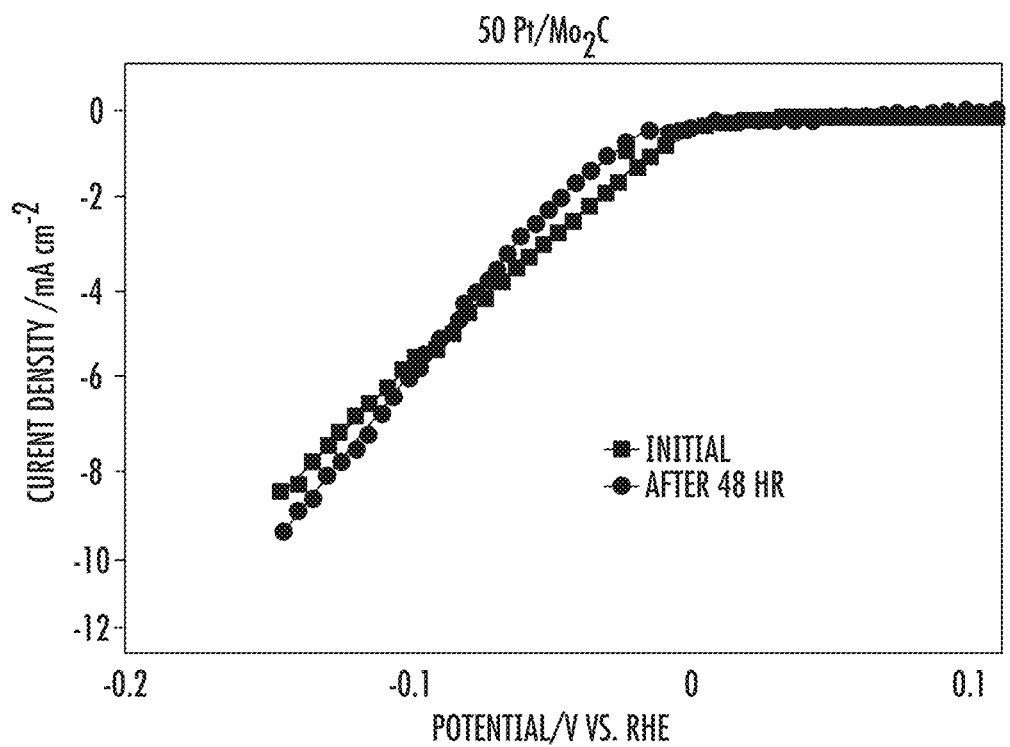
FIG. 8(b) illustrates durability tests with LSVs of 50 PT/Mo$_2$C according to embodiments described herein.
Figure 8C:
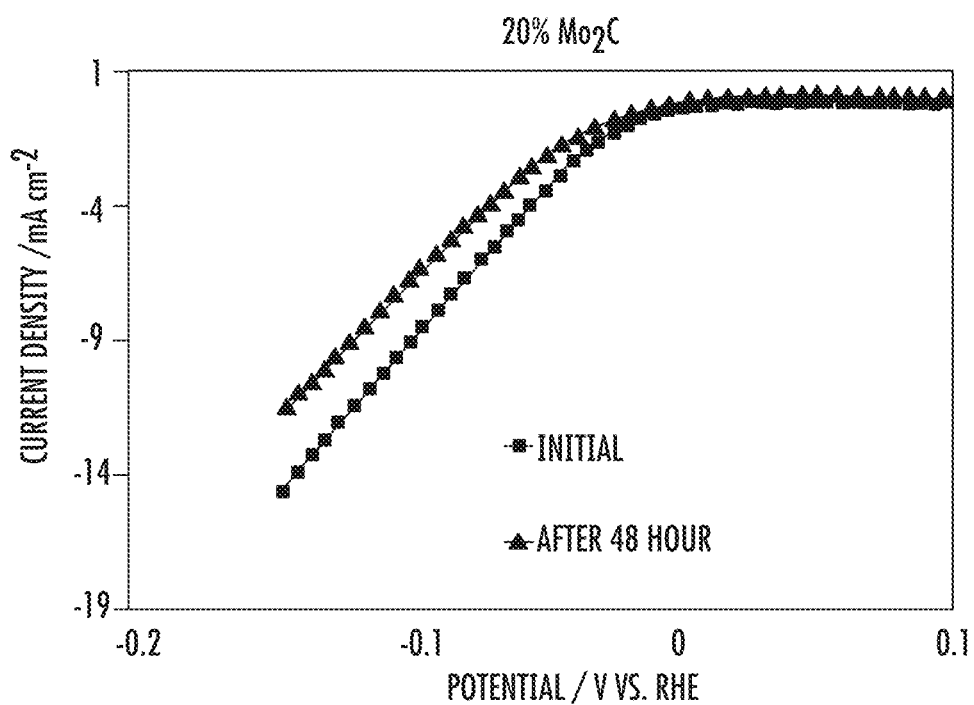
FIG. 8(c) illustrates durability tests with LSVs of 20% Pt/C according to embodiments described herein.
Figure 8D:
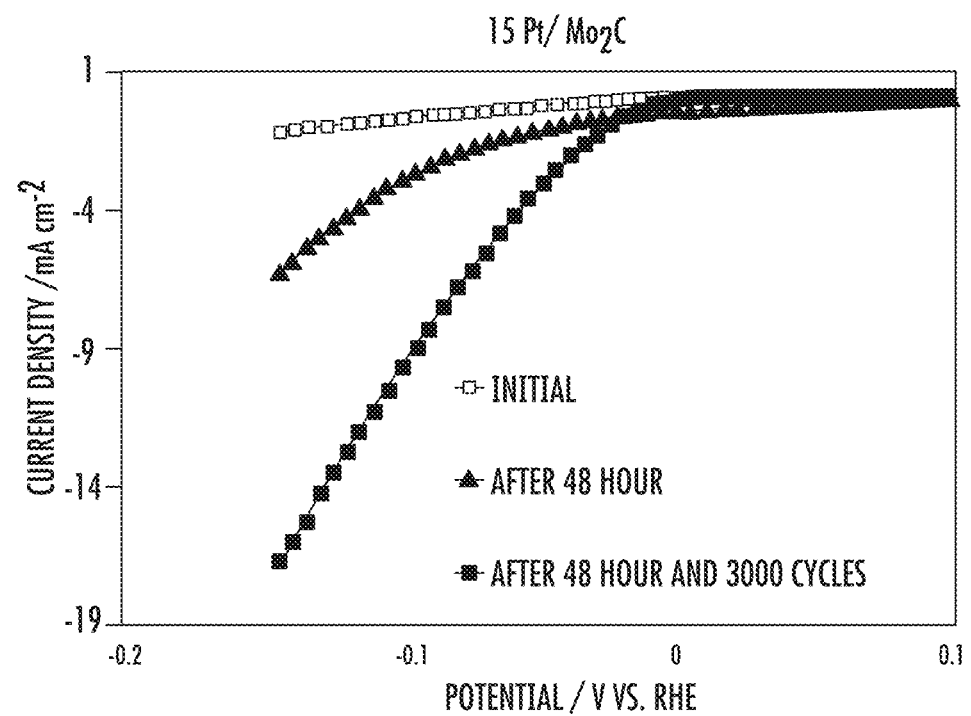
FIG. 8(d) illustrates 15 Pt/Mo$_2$C including the LSV after 3000 potential cycles according to embodiments described herein.

FIG. 8(a) illustrates durability tests with LSVs of 100 Pt/Mo$_2$C (11.9 μg Pt cm$^{-2}_{disk}$). FIG. 8(b) illustrates durability tests with LSVs of 50 PT/Mo$_2$C (2.9 μg Pt cm$^{-2}_{disk}$). FIG. 8(c) illustrates durability tests with LSVs of 20% Pt/C (54.3 μg Pt cm$^{-2}_{disk}$). Each of FIGS. 8(a)-8(c) illustrate results before and after 48 hours of CPE at −69 mV. FIG. 8(d) illustrates 15 Pt/Mo$_2$C including the LSV after 3000 potential cycles from −0.4 to 0.6V. The data of FIGS. 8(a)-(d) indicates a that 24% decrease in current density was observed for 20% Pt/C after 48 hours of CPE, with no significant change for 50 Pt/Mo$_2$C and 100 Pt/Mo$_2$C catalysts. Interestingly, 15 Pt/Mo$_2$C had a 205% increase in current density. Further analysis for 50 Pt/Mo$_2$C and 100 Pt/Mo$_2$C showed that there is a 3% increase for 50 Pt/Mo$_2$C, while 100 Pt/Mo$_2$C showed a 2.9% decrease.

FIG. 8(e) illustrates a graphical comparison of current density change at −0.1V potential after 48 hours of CPE for each of catalysts 20% Pt/C, 100 Pt/Mo$_2$C, 50 Pt/Mo$_2$C, and 15 Pt/Mo$_2$C. No further current density decay was observed for 50 Pt/Mo$_2$C, 100 Pt/Mo$_2$C and 20% Pt/C. Surprisingly, 15 Pt/Mo$_2$C exhibited an additional 225% increase in current density after the 3000 cycles of potential cycling (FIG. 8(d)).

Device Performance of Pt/Mo$_2$C Catalyst in PEMFC Anode

Figure 9A:
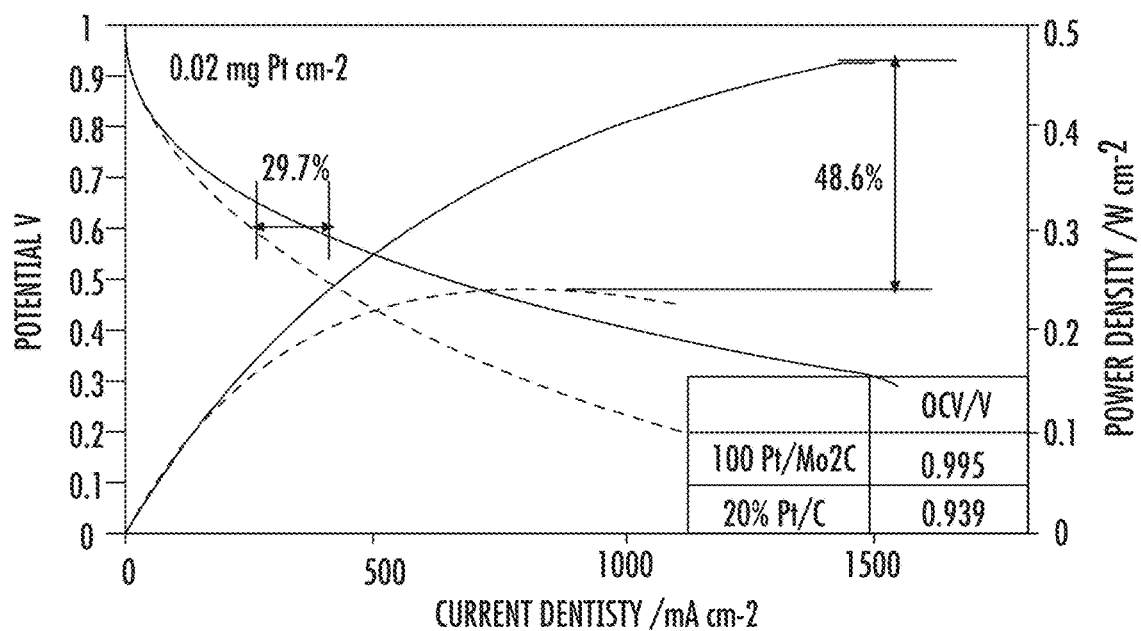
FIGS. 9(a)-(c) illustrate polarization and power density curve data of membrane electrode assemblies fabricated with 100 Pt/Mo$_2$C and 20% Pt/C according to embodiments described herein.
Figure 9B:
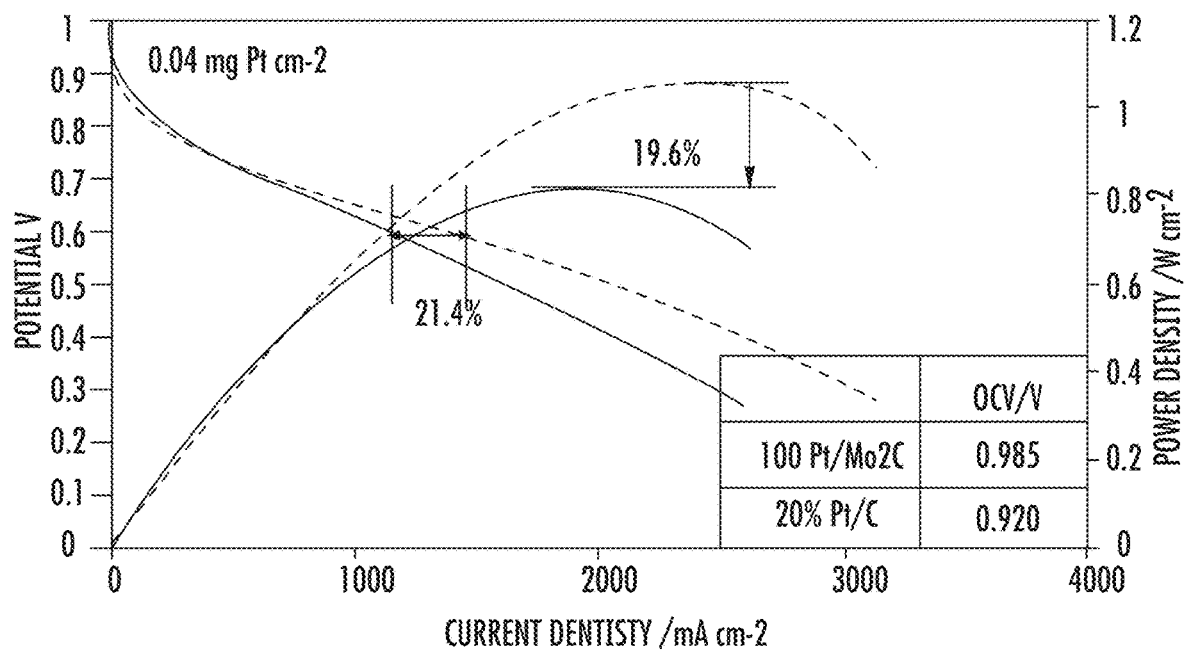
Figure 9C:
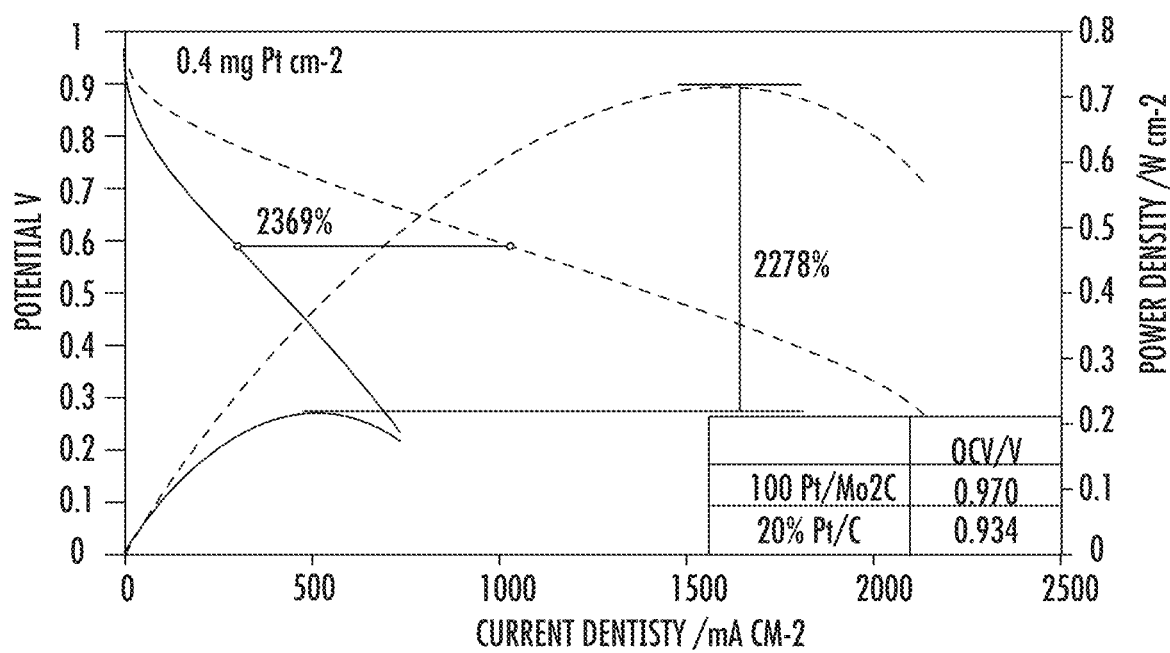

FIGS. 9(a)-(c) illustrate polarization and power density curve data of MEAs fabricated with 100 Pt/Mo$_2$C and 20% Pt/C via brush painting sigh SGL 10BC as the GDL (solid line 20% Pt/C; dashed line: 100 Pt/Mo$_2$C catalyst). The data represented in FIG. 9(a) utilizes an anode loading of 0.02 mg Pt cm$^{-2}$. The data represented in FIG. 9(b) utilizes an anode loading of 0.04 mg Pt cm$^{-2}$. The data represented in FIG. 9(c) utilizes an anode loading of 0.4 mg Pt cm$^{-2}$. The inset PCVs of FIGS. 9(a)-(c) refer to open circuit voltage. As illustrated in FIG. 9(a), 100 Pt/Mo$_2$C exhibited higher open circuit voltage (OCV) (0.995V) than commercially available 20% Pt/C (0.939V) for Pt loading of 0.02 mg cm$^{-2}$. Current density with 100 Pt/Mo$_2$C on the anode increased by 29.7%, while peak power density increased by 48.6%.

For increased Pt loadings in FIGS. 9(b) (0.04 mg cm$^{-2}$) and 9(c) (0.4 mg cm$^{-2}$), a similar OCV increase was observed in 100 Pt/Mo$_2$C (5.1%-6.6%). Current density and peak power density decreased for 100 Pt/Mo$_2$C for both 0.04 and 0.4 mg Pt cm$^{-2}$, partially resulting from significantly larger mass transfer resistance. Since 100 Pt/Mo$_2$C has 4.4% Pt mass loading, to achieve same Pt loading for 100 Pt/Mo$_2$C and 20% Pt/C, about five times total catalyst loading is applied on the GDL for 100 Pt/Mo$_2$C. For the same GDL area, the high total catalyst loading resulted in a much thicker catalyst layer and, consequently, increased mass transfer resistance. The higher open circuit potential for 100 Pt/Mo$_2$C indicates that 100 Pt/Mo$_2$C is more efficient than 20% Pt/C in generating electrons, which is consistent with the electrochemistry result shown in FIG. 6(b).

In summation, Pt nanoparticles of different sizes from three different ALD cycles can be successfully deposited onto phase-pure Mo$_2$C nanotube (atomic level for 15 ALD cycles, 2 nm for 50 ALD cycles, and 2.7 nm for 100 ALD cycles). Moreover, the Pt nanoparticle size changes with differences lattice spacing, binding energy shift between deposited Pt particles and Mo$_2$C nanotube support, HER activity and PEMFC anode performance of resultant catalysts. Specifically, two noticeable trends were observed in lattice spacing: 1) Pt particles of 2.7 nm showed increased lattice spacing from 0.21 nm to 0.24 nm; 2) those with a size of 2.0 nm have lattice spacing of 0.24 nm.

HER activity measurements and durability tests demonstrated that HER activity and durability for all three Pt modified Mo$_2$C samples are improved when compared to commercially available 20% Pt/C. In addition, excellent PEMFC anodic performance from 100 Pt/Mo$_2$C, relative to 20% Pt/C with low Pt loading (0.02 mg Pt cm$^{-2}$) demonstrated that the Pt/Mo$_2$C nanotube platform can be applied in a PEMFC anode or electrolyzer with further reduced Pt loading. It is also contemplated that the Pt/MO$_2$C nanotube platform may be utilized in a PEMFC cathode. Still further, it is contemplated that various other transition metal carbide nanotube catalyst system may be advantageously implemented in anodes or cathodes of a PEMFC. The combination of a rotatory ALD process and the unique nanotube Mo$_2$C support morphology provides for precise fine-tuning of Pt nanoparticle size by adjusting the number of ALD cycles. The catalyst systems described herein serve as a pathway to further reduce Pt loading without compromising durability.

While the foregoing is directed to embodiments of the present disclosure, other and further embodiments of the disclosure may be devised without departing from the basic scope thereof, and the scope thereof is determined by the claims that follow.

What is claimed is:

1. An electrochemical conversion apparatus, comprising:
   a membrane;
   a catalyst comprising platinum molybdenum carbide disposed on a first side and a second side of the membrane, wherein the platinum molybdenum carbide comprises phase pure molybdenum carbide and discrete nanoparticles of platinum formed on the molybdenum carbide, the phase pure molybdenum carbide comprising nanotubes with a diameter of about 15 nm to about 20 nm;
   a first gas diffusion layer disposed on the first side of the membrane, wherein the catalyst is disposed between the first gas diffusion layer and the membrane;
   a second gas diffusion layer disposed on the second side of the membrane, wherein the catalyst is disposed between the second gas diffusion layer and the membrane;
   an anode coupled to the first gas diffusion layer; and
   a cathode coupled to the second gas diffusion layer.

2. The apparatus of claim 1, wherein the discrete nanoparticles of the platinum have a diameter of less than about 3 nm.

3. The apparatus of claim 1, wherein the phase pure molybdenum carbide of the catalyst is hexagonal M$_{o2}$C.

4. The apparatus of claim 1, wherein the molybdenum carbide has a nanowire morphology.

5. The apparatus of claim 1, wherein the first side of the membrane is disposed opposite the second side of the membrane.

6. The apparatus of claim 1, wherein the anode comprises graphite.

7. The apparatus of claim 6, wherein the cathode comprises graphite.

8. An electrochemical conversion apparatus, comprising:
   a proton exchange membrane;
   a first catalyst disposed on a first side of the proton exchange membrane;
   a second catalyst disposed on a second side of the proton exchange membrane opposite the first catalyst, wherein at least one of the first catalyst or the second catalyst comprises a platinum molybdenum carbide containing material, the platinum molybdenum carbide containing material comprising a phase pure molybdenum carbide support comprising nanotubes with a diameter of about 15 nm to about 20 nm;
   a first gas diffusion layer disposed on the first side of the proton exchange membrane, wherein the first catalyst is disposed between the first gas diffusion layer and the proton exchange membrane;

a second gas diffusion layer disposed on the second side of the proton exchange membrane, wherein the second catalyst is disposed between the second gas diffusion layer and the proton exchange membrane;

an anode coupled to the first gas diffusion layer; and a cathode coupled to the second gas diffusion layer.

9. The apparatus of claim 8, wherein the platinum molybdenum carbide containing material further comprises:

a platinum layer deposited on the phase pure molybdenum carbide support.

10. The apparatus of claim 9, wherein the platinum layer is characterized by island-like growth.

11. The apparatus of claim 10, wherein the platinum layer comprises discrete nanoparticles with a diameter of less than about 3 nm.

12. The apparatus of claim 11, wherein the diameter of the discrete nanoparticles is about 1.5 nm to about 2.5 nm.

13. The apparatus of claim 8, wherein the phase pure molybdenum carbide support of the first catalyst or the second catalyst is hexagonal $M_{o2}C$.

14. The apparatus of claim 8, wherein the platinum molybdenum carbide containing material has a nanowire morphology.

15. The apparatus of claim 8, wherein the anode or the cathode comprise graphite.

16. An electrochemical conversion apparatus, comprising:

a proton exchange membrane;

a first catalyst disposed on a first side of the proton exchange membrane;

a second catalyst disposed on a second side of the proton exchange membrane opposite the first catalyst, wherein the first catalyst comprises platinum molybdenum carbide, the platinum molybdenum carbide further comprising:

a phase pure molybdenum carbide support comprising nanotubes with a diameter of about 15 nm to about 20 nm; and platinum nanoparticles deposited on the phase pure molybdenum carbide support, each platinum nanoparticle having a diameter of less than about 3 nm;

a first gas diffusion layer disposed on the first side of the proton exchange membrane, wherein the first catalyst is disposed between the first gas diffusion layer and the proton exchange membrane;

a second gas diffusion layer disposed on the second side of the proton exchange membrane, wherein the second catalyst is disposed between the second gas diffusion layer and the proton exchange membrane;

an anode coupled to the first gas diffusion layer; and a cathode coupled to the second gas diffusion layer.

17. The apparatus of claim 16, wherein the phase pure molybdenum carbide support of the first catalyst is hexagonal $M_{o2}C$.

18. The apparatus of claim 16, wherein the first gas diffusion layer or the second gas diffusion layer comprise a porous carbon containing material.

* * * * *